United States Patent
Hayashi (12)

(10) Patent No.: US 11,930,627 B2
(45) Date of Patent: Mar. 12, 2024

(54) ELECTRONIC EQUIPMENT USED IN A MEDICAL SITE UNDERGOING A STERILIZING TREATMENT

(71) Applicant: Susa Inc., Tokyo (JP)

(72) Inventor: Yukinori Hayashi, Tokyo (JP)

(73) Assignee: Susa Inc., Tokyo (JP)

( * ) Notice: Subject to any disclaimer, the term of this patent is extended or adjusted under 35 U.S.C. 154(b) by 39 days.

(21) Appl. No.: 17/728,475

(22) Filed: Apr. 25, 2022

(65) Prior Publication Data

US 2022/0354029 A1  Nov. 3, 2022

(30) Foreign Application Priority Data

Apr. 28, 2021  (JP) .................................. 2021-075675
Nov. 11, 2021  (JP) .................................. 2021-184272

(51) Int. Cl.
| H05K 7/20 | (2006.01) |
| H05K 5/00 | (2006.01) |
| H05K 5/03 | (2006.01) |
| H05K 5/06 | (2006.01) |

(52) U.S. Cl.
CPC ....... *H05K 7/20963* (2013.01); *H05K 5/0008* (2013.01); *H05K 5/0017* (2013.01); *H05K 5/03* (2013.01); *H05K 5/06* (2013.01)

(58) Field of Classification Search
None
See application file for complete search history.

(56) References Cited

U.S. PATENT DOCUMENTS

| 10,386,897 B2 | 8/2019 | Rivera, Jr. et al. |
| 2003/0043541 A1 | 3/2003 | Yuasa et al. |
| 2009/0175003 A1* | 7/2009 | Ali ........................ G06F 1/203 361/695 |
| 2009/0219673 A1* | 9/2009 | Tamura .................. G06F 1/203 361/676 |
| 2010/0096963 A1 | 4/2010 | McLaughlin et al. |
| 2011/0005648 A1* | 1/2011 | Sa ........................ G06F 1/1613 53/469 |

(Continued)

FOREIGN PATENT DOCUMENTS

| JP | 2001-350546 A | 12/2001 |
| JP | 2001350546 A * | 12/2001 ............. A01N 25/10 |

(Continued)

OTHER PUBLICATIONS

Japanese Office Action dated Nov. 24, 2021, in connection with corresponding JP Application No. 2021-184272 (9 pp., including machine-generated English translation).

*Primary Examiner* — Xanthia C Relford
(74) *Attorney, Agent, or Firm* — McCormick, Paulding & Huber PLLC

(57) ABSTRACT

Electronic equipment allowed to endure repetitive severe environmental change in a sterilizing treatment using an autoclave is provided. A tablet terminal (electronic equipment) 106 includes: an enclosure 10; a substrate 30 arranged in an internal space of the enclosure 10; an electronic circuit component 40 mounted on the substrate 30; a (first) heat insulating layer 50 formed along the enclosure 10; and a (first) heat release mechanism 70 allowed to discharge heat from an internal space of the heat insulating layer 50 to outside of the enclosure 10.

18 Claims, 20 Drawing Sheets

(56) References Cited

U.S. PATENT DOCUMENTS

| | | | |
|---|---|---|---|
| 2012/0081853 A1* | 4/2012 | Huang | G06F 1/1656 |
| | | | 361/679.21 |
| 2012/0222985 A1* | 9/2012 | Kenney | H05K 5/0008 |
| | | | 156/212 |
| 2014/0092537 A1* | 4/2014 | Bae | B32B 5/12 |
| | | | 361/679.01 |
| 2014/0146448 A1* | 5/2014 | Yoo | B29C 45/14336 |
| | | | 361/679.01 |
| 2018/0239399 A1 | 8/2018 | Nakada et al. | |
| 2019/0013830 A1* | 1/2019 | Hoglund | A61B 90/90 |
| 2020/0382151 A1 | 12/2020 | Pine | |
| 2021/0191535 A1* | 6/2021 | Hayashi | G06F 1/1658 |

FOREIGN PATENT DOCUMENTS

| | | | |
|---|---|---|---|
| JP | 2009-211133 A | | 9/2009 |
| JP | 2013-026229 A | | 2/2013 |
| JP | 2013026229 A | * | 2/2013 |
| JP | 2018-136908 A | | 8/2018 |

* cited by examiner

ELECTRONIC EQUIPMENT USED IN A MEDICAL SITE UNDERGOING A STERILIZING TREATMENT

CROSS-REFERENCE TO RELATED APPLICATION

The present application claims priority from Japanese Patent Application No. 2021-75675 filed on Apr. 28, 2021, and Japanese Patent Application No. 2021-184272 filed on Nov. 11, 2021, the contents of each of which are hereby incorporated by reference into this application.

TECHNICAL FIELD

The present invention relates to electronic equipment such as mobile information terminal devices suitable to be used in medical sites or others in the electronic equipment.

BACKGROUND

Mobile information terminal devices are exemplified as one example of the electronic equipment used in the medical sites or others. Such a mobile information terminal device is one type of computers, and is an easily portable computer as represented by, for example, a tablet-type computer, a smartphone and others. The mobile information terminal device includes a display (monitor) displaying images, an electronic circuit component and an enclosure (see, for example, Japanese Patent Application Laid-Open Publication No. 2018-136908 (Patent Document 1).

PRIOR ART

Patent Document 1: Japanese Patent Application Laid-Open Publication No. 2018-136908

SUMMARY

Application of electronic equipment expands to various environments, and the electronic equipment is also used in, for example, medical sites such as hospitals in some cases. There are needs for high-level medical services using the electronic equipment such as the mobile information terminal device in environment such as an examination room, a hospital ward, a test room, a surgery room, a rehabilitation room, a nursing care site, a food preparation room or others. Examples of the application include examination performed by a doctor or others who is operating the medical equipment through the mobile information terminal device, and examination and medical service, etc., performed by a doctor, a medical staff, etc., who is displaying an image (two-dimensional or three-dimensional image) for the examination or surgery onto a display screen of the mobile information terminal device (or a different display device from the mobile information terminal device) and operating the mobile information terminal device.

Medical tools or others used in the medical sites are disinfected, sterilized or others at a necessary level for infection prevention. As the sterilizing treatment, for example, an autoclave treatment is exemplified. In the autoclave treatment, a target object is exposed to water vapor under predetermined high temperature and high pressure for predetermined time or longer. Also to medical mise, a disinfecting treatment, more desirably a sterilizing treatment is necessary for the infection prevention, and its performance in a point of view of heat resistance, water resistance, pressure resistance, waterproof performance, endurance and others is needed.

However, general related-art electronic equipment is unable to endure the sterilizing treatment such as the autoclave treatment. Such electronic equipment is configured to include a component such as an electronic circuit component that is susceptible to heat and water. In the electronic equipment that undergoes the autoclave treatment, high temperature heat reaches the electronic circuit component inside the enclosure, and leads to damage of the electronic circuit component. If the electronic equipment has an opening used for setting an image sensor, a display panel or others, heat of highly-pressurized water vapor generated by the autoclave treatment directly reaches the component such as the electronic circuit component inside the enclosure particularly through the opening of the enclosure, and besides, the water vapor easily enters. As a result, the damage of the component increases.

An aim of the present invention is to provide, for example, electronic equipment allowed to endure repetitive severe environmental change in the sterilizing treatment using the autoclave or others.

A typical embodiment of the present invention includes the following configuration: Electronic equipment according to one embodiment includes: an enclosure; a substrate arranged in an internal space of the enclosure; an electronic circuit component mounted on the substrate; a first heat insulating layer formed along the enclosure; and a first heat release mechanism allowed to discharge heat in an internal space of the first heat insulating layer to outside of the enclosure.

A typical embodiment of the present invention provides electronic equipment that endures repetitive severe environmental change in a sterilizing treatment using an autoclave or others.

BRIEF DESCRIPTIONS OF THE DRAWINGS

DETAILED DESCRIPTION

Hereinafter, embodiments of the present invention will be described in detail with reference to the accompanying drawings. Note that the same components are denoted with the same reference signs in principle throughout all the drawings for describing the embodiment, and the repetitive description thereof will be omitted. In plan views and cross-sectional views, coordinate axes in an X direction, a Y direction and a Z direction are shown in order to make directions of components and devices clear. The X direction and the Y direction are coordinate axes included in an X-Y plane in parallel to the front surface portion (such as a surface where the display screen is arranged) of the enclosure of the tablet terminal. The Z direction is a coordinate axis in a direction orthogonal to the X-Y plane, in other words, a thickness direction of the tablet terminal.

<Outline of Mobile Information Terminal Device>

Figure 1:
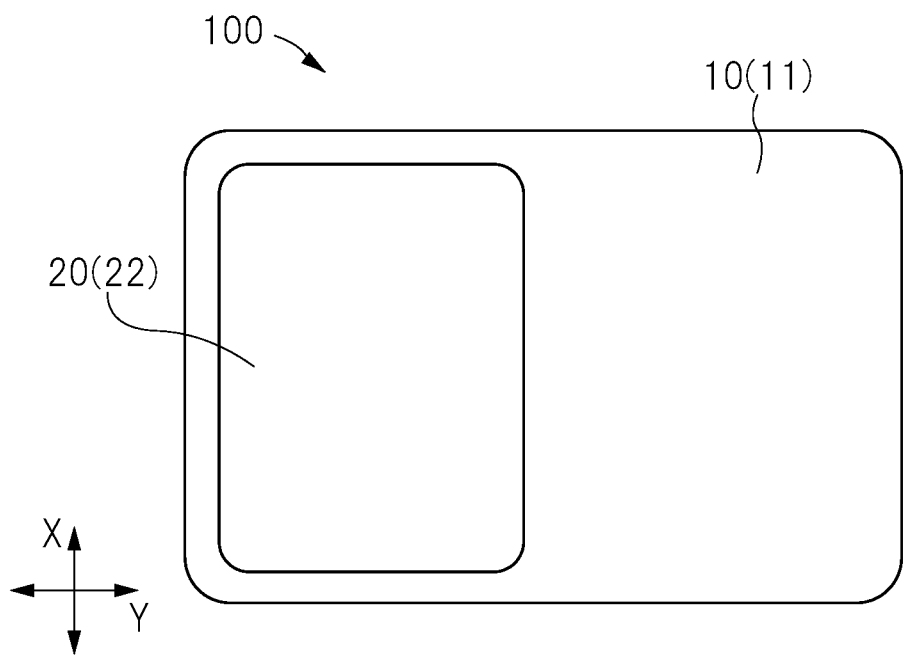
FIG. 1 is a plan view showing an outline of a front surface of a tablet terminal that is a mobile information terminal device of one embodiment.
Figure 2:
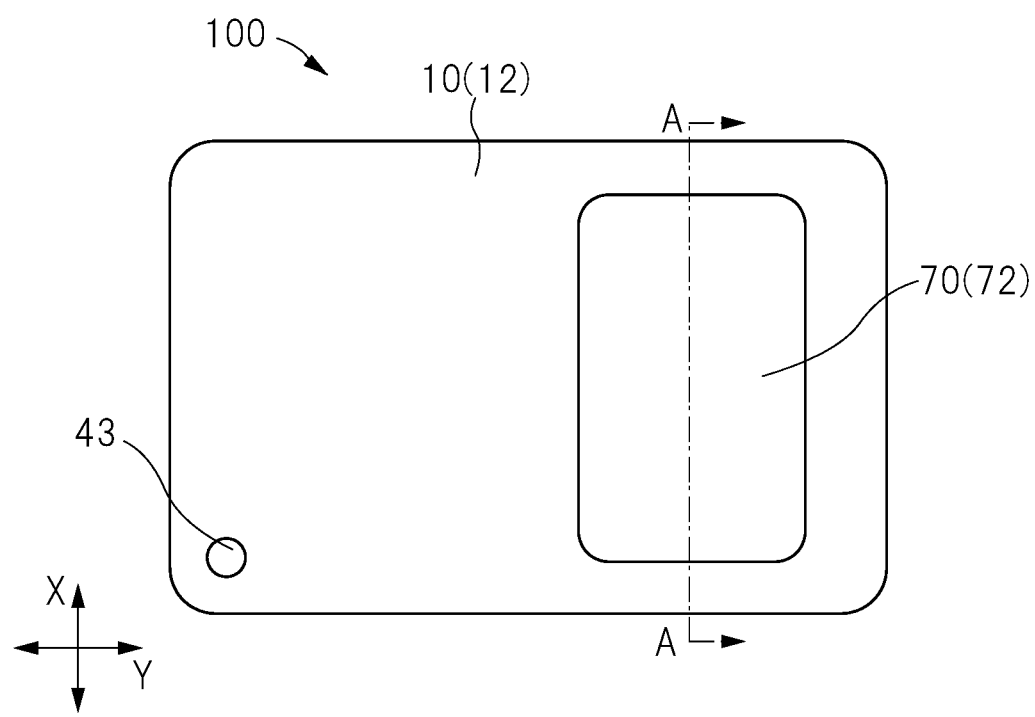
FIG. 2 is a plan view showing an outline of a back surface of the tablet terminal shown in FIG. 1.
Figure 3:
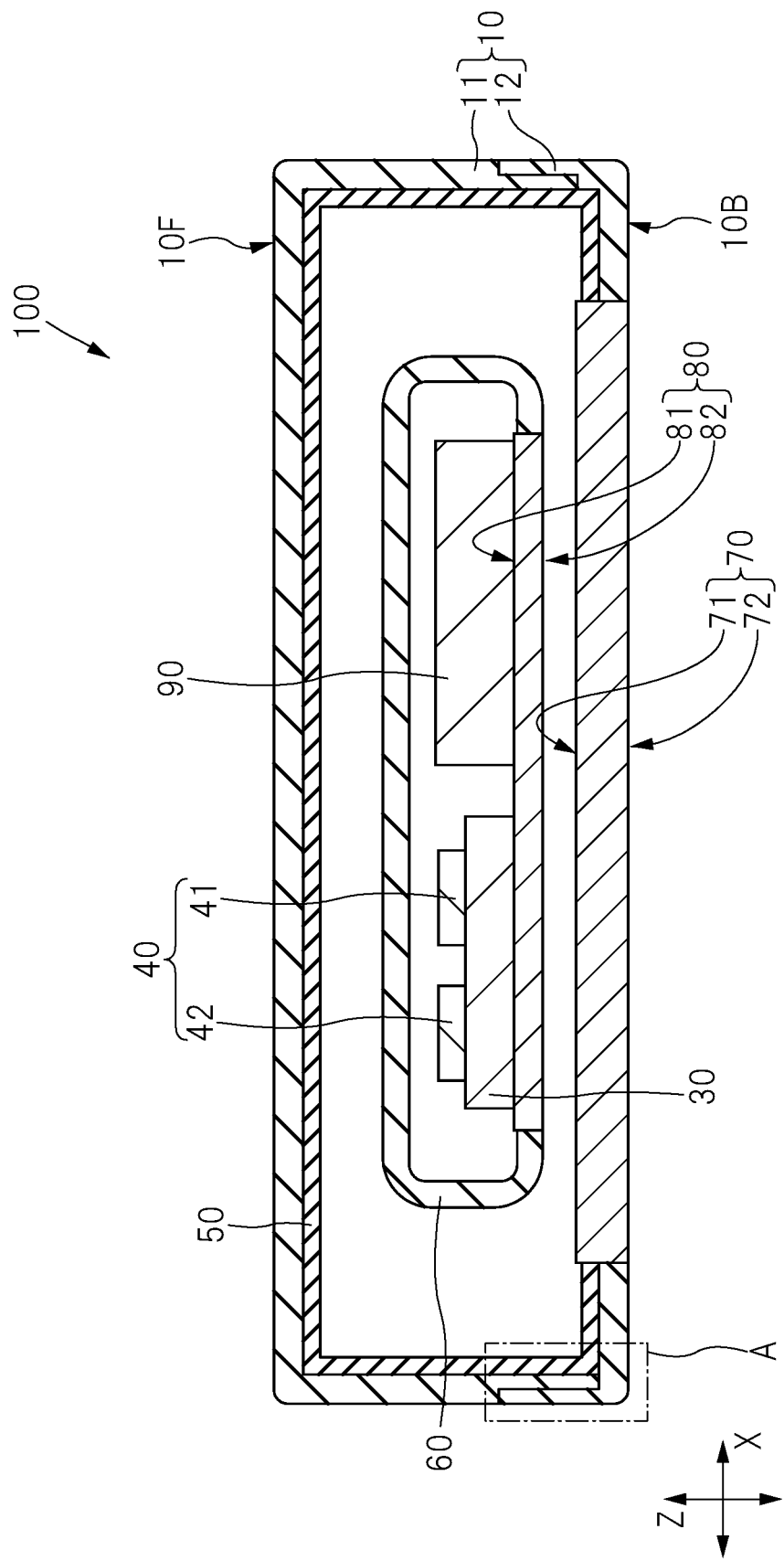
FIG. 3 is a cross-sectional view taken along a line A-A of FIG. 2.

First, an outline of a mobile information terminal device that is one example of electronic equipment of an embodiment of the present invention will be explained with reference to FIGS. 1 to 3. The information terminal device is a terminal device that can perform either one or both of an input processing for receiving information (data) as a signal from outside to be input and an output processing for outputting the information (data) as the signal to outside. The information terminal device explained below can be interpreted as an information input/output terminal device. Also, a mobile information terminal device is an information terminal device, a weight and a size of which are portable, of the above-described information terminal devices, and which is easily carried by, for example, a human's hand to be available. FIG. 1 is a plan view showing an outline of a front surface of a tablet terminal that is a mobile information terminal device of one embodiment. FIG. 2 is a plan view showing an outline of a back surface of the tablet terminal shown in FIG. 1. FIG. 3 is a cross-sectional view taken along a line A-A of FIG. 2.

In the present embodiment, a tablet terminal 100 as exemplified by a terminal that is so-called iPad (product name: registered trademark) will be explained as one example of the electronic equipment. However, the electronic equipment to which a below-explained technique is applied is not limited to the tablet terminal 100 but also widely applicable to various mobile information terminal devices such as a smartphone. Although described in detail later, the below-explained technique is applicable to a wide variety of electronic equipment other than the mobile information terminal device. The tablet terminal 100 is, for example, a medical-use information terminal device intended to medical care. For example, in medical services such as examination, test, procedure and surgery, application of a medical system using the medical-use information terminal device is desired in some cases. The medical system may include an external computer or medical equipment connected through the medical-use information terminal device in some cases. In the medical system, a medical staff such as a doctor can perform an action relating to the medical care such as the examination, the test, the therapy or others, by using the medical-use information terminal device to operate the computer or the medical equipment. As described above, the medical system using the mobile medical-use information terminal device can improve efficiency of the medical care. The mobile medical-use information terminal device having a function of an operational panel of the medical equipment will be explained below. However, the below-described technique is applicable to the mobile medical-use information terminal device, and is also applicable to a wide variety of electronic equipment allowed to undergo the sterilizing treatment using the autoclave. Examples of the electronic equipment to which the below-explained technique is applicable will be described later.

The sterilizing treatment using the autoclave is performed to the medical-use information terminal device touched by the medical staff in order to improve hygienic environment in the medical site such as the hospital. If the medical-use information terminal device has the endurance allowing the sterilizing treatment using the autoclave, the sterilized medical-use information terminal device can be used every time by, for example, the sterilizing treatment for every use, and therefore, the infection prevention is made reliable. Therefore, the mobile information terminal device that is available for the medical care needs to have the high endurance against the sterilizing treatment using the autoclave or others as different from a general tablet terminal or others.

The sterilizing treatment using the autoclave is achieved by exposing a sterilizing-target object to atmosphere such as the water vapor maintained at a high temperature and a high pressure. Therefore, the mobile information terminal device allowed to undergo the sterilizing treatment using the autoclave needs to have heat resistance, pressure resistance, water resistance, and others. In the case of the mobile information terminal device, the electronic circuit component embedded in the enclosure and the substrate on which the electronic circuit component is mounted particularly tend to be damaged by heat and water. Therefore, when attention is paid to the electronic circuit component and the substrate, a heat-resistant performance and a water-resistant performance are particularly important in order to allow the sterilizing treatment using the autoclave. Of course, damage of the enclosure due to the high pressure causes breakage of the components inside the enclosure, and therefore, the enclosure needs to have a pressure-resistant performance. The pressure-resistant performance includes not only an endurance performance against a higher pressure than atmospheric pressure but also an endurance performance against a lower pressure than the atmospheric pressure. Also, if the highly-pressurized vapor contains a chemical material other than water, the enclosure also needs to have a chemical-resistant performance.

Further, the mobile information terminal device includes the electronic circuit component, and the electronic circuit component included in the mobile information terminal device that is a mobile computer includes a semiconductor component including a computing processor circuit. For example, in the example shown in FIG. 3, a data processing component 41 is the semiconductor component including the computing processor circuit. The "computing processor circuit" described in the specification is a circuit for controlling so-called computer system, and has a function of, for example, performing a computing processing based on a plurality of input signals and outputting a command signal to other circuits. The data processing component 41 includes a system including the computing processor circuit, a memory circuit and a control circuit for controlling communication between circuits. Such an electronic circuit component in which the system is built in one package is called system-in package. While electric power is necessary for operation of the computing processing circuit formed in the semiconductor component, temperatures of components such as the semiconductor component and a battery may be increased by heat generation in the semiconductor component due to the electric power consumption in some cases. The increase in the temperature of the semiconductor component or others becomes a cause of decrease in a performance of the semiconductor component or others. Therefore, the mobile information terminal device allowed to undergo the sterilizing treatment using the autoclave needs to have a heat-release performance that discharges the heat generated in the semiconductor component in usage in addition to the endurances. In other words, the medical-use mobile information terminal device needs to have a heat-insulating performance that prevents heat entry from outside and a heat-release performance that discharges the inner heat to outside. These two performances are in a trade-off relation.

As shown in FIG. 3, the tablet terminal 100 of the present embodiment includes: an enclosure 10; a display 20 (see FIG. 1) a part of which is exposed out from the enclosure 10; a substrate 30 arranged inside the enclosure 10; an electronic circuit component 40 mounted on the substrate 30; a heat insulating layer 50 formed along the enclosure 10; and a heat insulating layer 60 that separates from the heat insulating layer 50 and that is formed to surround the substrate 30 and the electronic circuit component 40.

The heat insulating layer 50 prevents the heat entry into the enclosure 10. The heat insulating layer 60 prevents the heat entry from a gap between the heat insulating layer 50 and the heat insulating layer 60 into the heat insulating layer 60 (that is a region where the substrate 30 and the electronic circuit component 40 are arranged). In the example shown in FIG. 3, the heat insulating layer 50 is in contact with the enclosure 10. The heat insulating layer 60 separates from the heat insulating layer 50. In the gap between the heat insulating layer 50 and the heat insulating layer 60, note that a member such as a support member not illustrated may be arranged, or the gap shown in FIG. 3 may be arranged. The support member may be a member having the heat insulating performance, or may have a property that holds and fixes the heat insulating layer 60.

The heat insulating layers 50 and 60 function as a water-proof barrier that suppresses the moisture entry through the enclosure 10. Although described in detail later, the enclosure 10 may be provided with an opening used for attaching a component such as an optical component that needs to transmit/receive light to/from outside of the tablet terminal 100 in some cases. In a structure simply housing the substrate 30 and the electronic circuit component 40 as they are, moisture or others entering from the opening may contaminate the substrate 30 and the electronic circuit component in some cases. On the other hand, in the case as described in the present embodiment in which the substrate 30 and the electronic circuit component 40 are covered with the heat insulating layer 50, the moisture or others entering from the opening is blocked by the heat insulating layer 50, and is difficult to reach the substrate 30 and the electronic circuit component 40. Also, depending on a degree of the entering moisture or others, the moisture or others may be absorbed because of a moisture absorbent function of the heat insulating layers 50 and 60 in some cases.

The tablet terminal 100 includes: a heat release mechanism 70 in contact with the heat insulating layer 50; and a heat release mechanism 80 in contact with the heat insulating layer 60. The heat release mechanism 70 has a function that discharges the heat in the gap between the heat insulating layer 50 and the heat insulating layer 60 to outside of the enclosure 10. The heat release mechanism 70 has a heat absorbent surface 71 exposed into the heat insulating layer 50 and a heat release surface 72 exposed out from the enclosure 10. A transmission direction of the heat by the heat release mechanism 70 can be electrically controlled. For example, by energization in the heat release mechanism 70, the heat in the gap between the heat insulating layer 50 and the heat insulating layer 60 is absorbed by the heat absorbent surface 71 of the heat release mechanism 70, and is released out of the heat release surface 72 of the heat release mechanism 70. Similarly, the heat release mechanism 80 has a function that discharges the heat in the gap surrounded by the heat insulating layer 60 to the gap between the heat insulating layer 50 and the heat insulating layer 60. The heat release mechanism 80 has a heat absorbent surface 81 exposed into the heat insulating layer 60 and a heat release surface 82 being opposite to the heat absorbent surface 81 and exposed out from the heat insulating layer 60. A transmission direction of the heat by the heat release mechanism 80 can be electrically controlled. For example, by energization in the heat release mechanism 80, the heat in the gap surrounded by the heat insulating layer 60 is absorbed by the heat absorbent surface 81 of the heat release mechanism 80, and is released out of the heat release surface 82 of the heat release mechanism 80. The heat release surface 72 of the heat release mechanism 70 is exposed out from the enclosure 10. Therefore, even if the heat is generated in the electronic circuit component at the time of the usage of the tablet terminal 100, the heat is released out of the enclosure 10 through the heat release mechanism 70 and the heat release mechanism 80. As a result, at the time of the usage of the tablet terminal 100, the increase in the temperature of the electronic circuit component 40 can be suppressed, and the decrease in the performance of the tablet terminal 100 due to the increase in the temperature of the electronic circuit component 40 can be suppressed.

Also, each of the heat release mechanism 70 and the heat release mechanism 80 has a function that suppresses the increase in the temperature of the internal space of the enclosure 10 during the autoclave treatment. For example, in the sterilizing treatment using the autoclave to the tablet terminal 100, the heat release mechanism 70 and the heat release mechanism 80 are energized. Each of the heat release mechanism 70 and the heat release mechanism 80 is a component that can control the heat transmission direction. Even if a peripheral temperature of the tablet terminal 100 is higher than an internal temperature of the tablet terminal 100, the heat is absorbed by the heat absorbent surface 71 and the heat absorbent surface 81, and is released out of the heat release surface 72 and the heat release surface 82. Therefore, even if the heat enters the enclosure 10 during the autoclave treatment, the entering heat is discharged out through the heat release mechanism 70 and the heat release mechanism 80. In other words, the heat release mechanism 70 and the heat release mechanism 80 are not simply heat insulating members that block the heat transmission but function as temperature-increase suppressing members that suppress the increase in the temperature of the internal space of the enclosure 10 by actively transmitting the heat while controlling the heat transmission direction.

As the heat release mechanisms 70 and 80, a thermoelectric element having a function that transforms thermal energy and electrical energy can be used as a heat release component that can control the heat transmission direction. The function of each of the heat release mechanisms 70 and 80 can be easily achieved by, for example, usage of a Peltier element utilizing the Peltier effect that transforms the electrical energy and the thermal energy. A detailed structure of each heat release mechanism using the Peltier element will be described later.

In the example shown in FIG. 3, the heat absorbent surface 71 of the heat release mechanism 70 and the heat release surface 82 of the heat release mechanism 80 are arranged to face each other. In this case, the heat that is released out of the heat release surface 82 of the heat release mechanism 80 can be efficiently absorbed by the heat absorbent surface 71. Therefore, in consideration of the efficiency of the heat release from a peripheral region of the electronic circuit component 40, it is preferable to arrange the heat absorbent surface 71 and the heat release surface 82 to face each other as shown in FIG. 3. However, a structure without the facing of the heat absorbent surface 71 and the heat release surface 82 is also applicable as a modification example of FIG. 3 although not illustrated. This case causes a lower heat release efficiency than that of the example shown in FIG. 3, but can improve the heat release efficiency more than that of a tablet terminal of a study example (illustration is omitted) without the heat release mechanisms 70 and 80 since the heat in the heat insulating layer 60 can be released out by the heat release mechanism 80 while the heat in the enclosure 10 can be released out of the enclosure 10 by driving the heat release mechanism 70.

<Layout of Embedded Components>

Figure 4:
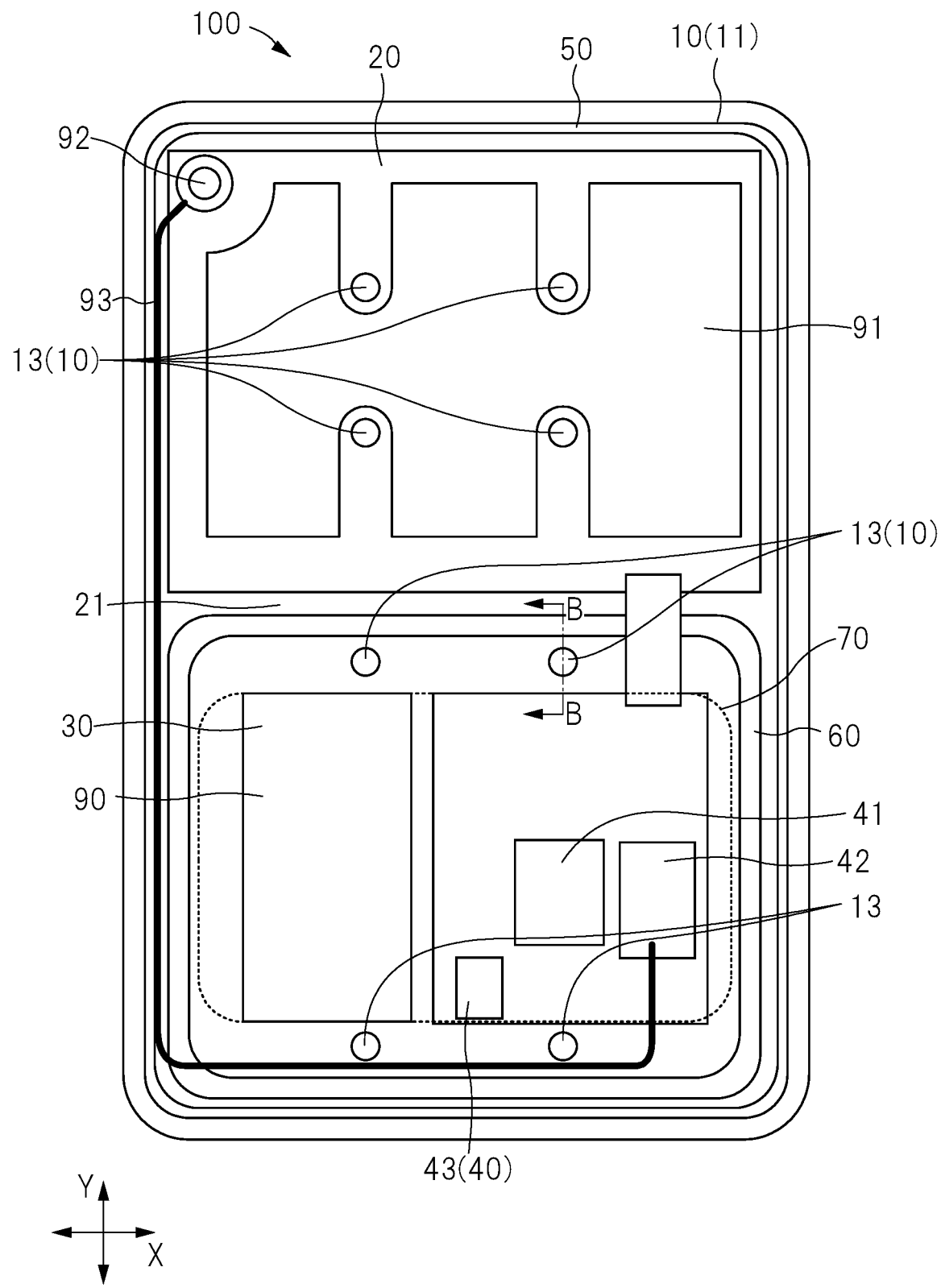
FIG. 4 is a plan view showing a back surface portion of an enclosure shown in FIG. 2 and a state of an inner heat insulating layer shown in FIG. 3 from which a portion of in a region of the back surface is detached.

Next, a layout example of each component embedded in the tablet terminal will be explained. FIG. 4 is a plan view showing the back surface portion of the enclosure shown in FIG. 2 and a state of the inner heat insulating layer shown in FIG. 3 from which a portion in a region of the back surface is detached. Since the heat release mechanism 70 is attached to the back surface portion 12 of the enclosure 10 as shown in FIG. 3, the heat release mechanism 70 in FIG. 4 showing the state of the detachment of the back surface portion 12 is also detached. However, in FIG. 4, an outline of the heat release mechanism 70 is illustrated with a dot line in order to define a positional relation between the heat release mechanism 70 and the substrate 30, the electronic circuit component 40 or a secondary battery 90. The enclosure 10 shown in FIGS. 1 to 3 has the front surface portion 11 having a front surface 10F and the back surface portion 12 having a back surface 10B opposite to the front surface 10F. The display 20 (see FIG. 1) is attached to the front surface portion 11. The heat release mechanism 70 is attached to the back surface portion 12 opposite to the front surface portion 11. The front surface portion 11 and the back surface portion 12 are screwed and fixed to each other by, for example, a plurality of support portions 13, and are structured to be separatable from each other by loosening the plurality of screws (see FIG. 5 described later).

In the example of the present embodiment, optical components such as a lens 92 and an optical fiber cable 93 in addition to the electrical components such as the display (display panel module) 20, a flexible wiring board 21, the substrate 30, the plurality of electronic circuit components 40, the secondary battery 90 and a charge coil 91 are housed inside the enclosure 10. Note that types, numbers and layouts of the components shown in FIG. 4 are one example, and have various modification examples. For example, there is a case of inclusion of an electrical component or an optical component in addition to the components shown in FIG. 4 or a case of exclusion of a (some) components. The layout of the components shown in FIG. 4 has various modification examples depending on the heat resistance or the endurance against the environmental change of each component. For example, if the heat resistance of the secondary battery 90 is high, the secondary battery 90 may be arranged between the heat insulating layer 50 and the heat insulating layer 60 in some cases. Also in various modification examples explained below, types, numbers and layouts of the various electronic components in the electronic equipment have various modification examples, and the components are arranged in suitable positions depending on the endurances of the electronic components.

For example, the charge coil 91 is a coil for charging the secondary battery 90 using electromagnetic induction. The charge coil 91 may be not embedded in a structure provided with a connector for use in connection with an external power supply device in place of the charge coil 91. However, in order to improve the waterproof performance and the heat insulation inside the enclosure 10, the smaller number of the openings of the enclosure 10 is preferable. In a charging method case using the charge coil 91 shown in FIG. 4, the secondary battery 90 can be charged even without the connector for use in the connection with the external power supply device, and therefore, this case is preferable for reducing the number of the openings of the enclosure 10.

The plurality of electronic circuit components 40 are mounted on the substrate 30. In the example shown in FIG. 4, the plurality of electronic circuit components 40 include a data processor component 41, an image capture (image sensor) 42 and an electromagnetic sensor 43.

The data processor component 41 is, for example, a semiconductor component including: a computing processor circuit performing data processing; and a control circuit controlling electrical and optical operations of the tablet terminal 100. The electronic circuit component including the computing processor circuit performing the data processing as described above may be called logic component in some cases. The data processor component 41 that is the logic component is a component that particularly easily generates heat among the plurality of electronic circuit components 40. The computing processor circuit included in the data processor component 41 is a component, a processing performance of which is easily reduced by thermal influence in the usage of the tablet terminal 100. Therefore, as shown in FIG. 3, the data processor component 41 preferably overlaps the heat release mechanism 80 and the heat release mechanism 70 in the thickness direction of the tablet terminal 100. In this manner, a heat release route from the data processor component 41 to the outside of the enclosure 10 can be shortened, and therefore, the heat release performance can be improved. In the example shown in FIG. 4, the data processor component 41 is connected with the display 20 through the flexible wiring board 21. The display operation of the display 20 is controlled by, for example, the data processor component 41.

The image capture 42 is an electronic circuit component (that is also an optical component) including a photoelectric conversion circuit converting an optical image to an electrical signal, and is optically connected with the lens 92 through the optical fiber cable 93. The present embodiment adopts a light-image direct transmission method that transmits the light image (optical image) from the lens 92 to the image capture 42. The light (light image) emitted from outside to the lens 92 is transmitted to the image capture 42 through the optical fiber cable 93, and is converted into the electrical signal by the image capture 42. This electrical signal is transmitted to the data processor component 41 through the wiring formed in the substrate 30, and is processed by the data processor component 41. The optical components such as the lens 92 and the optical fiber cable 93 are more difficult to be damaged even by the thermal influence or the moisture influence than the electronic circuit components such as the image capture 42. The lens 92 needs to receive the light from the outside of the enclosure 10, and therefore, needs to be arranged at a position at which the light is taken in through the opening or a window of the enclosure 10. On the other hand, when the image capture 42 is near the lens, while the light attenuation can be suppressed, the image capture 42 is susceptible to the heat. Accordingly, in the example shown in FIG. 4, a part of the optical fiber cable 93 and the lens 92 are arranged outside the heat insulating layer 60, and the image capture 42 is arranged inside the heat insulating layer 60. In this case, even in the sterilizing treatment using the autoclave performed to the tablet terminal 100, the image capture 42 can be prevented from being damaged by the heat while the light can be received by the image capture 42. As one example of the light-image direct transmission method, note that the method of transmitting the light image to the image capture 42 through the lens 92 and the optical fiber cable 93 has been explained. As a modification example of the light-image direct transmission method, for example, a transmission method using an optical element such as a rod lens or a lens barrel is also effective.

The electromagnetic sensor 43 is a sensor for use in input from the outside. To the electromagnetic sensor 43, external command or information is input by an electromagnetic communication method. The input information is converted into the electrical signal, and is transmitted to, for example, the data processor component 41. As the input information, for example, identification information of a patient to be medically treated, tested or others can be exemplified. An input method using a device such as the electromagnetic sensor 43 capable of inputting the information in contactless to the tablet terminal 100 is preferable in a point of view of suppression of the contamination of the tablet terminal 100. In FIG. 4, note that the input method of inputting the external information using the electromagnetic communication method has been explained as one example. However, the input method includes various modification examples such as an optical method in addition to the electromagnetic method. Even in an input method using so-called touch panel, the information may be input without the direct contact to the tablet terminal 100 by usage of an input tool such as a touch pen.

In the example shown in FIG. 4, the data processor component 41, the image capture 42 and the electromagnetic sensor 43 have been exemplified and explained as the plurality of electronic circuit components 40. However, the type and the number of the electronic circuit components 40 include various modification examples. For example, the functions of the data processor component 41, the image capture 42 and the electromagnetic sensor 43 may be integrated into one electronic circuit component 40. Alternatively, for example, FIG. 4 shows the example in which the computing process function and the control functions are integrated into one data processor component 41. However, a plurality of data processor components 41 may be mounted for achieving high functionality of the tablet terminal 100. The larger the number of the data processor components 41 is, the more the processing speed is improved, but the more the heat generation amount is. Therefore, it is very important to improve the heat release efficiencies of the heat release mechanisms 70 and 80 shown in FIG. 3.

<Heat Insulating Structure and Sealing Structure>

Figure 5:
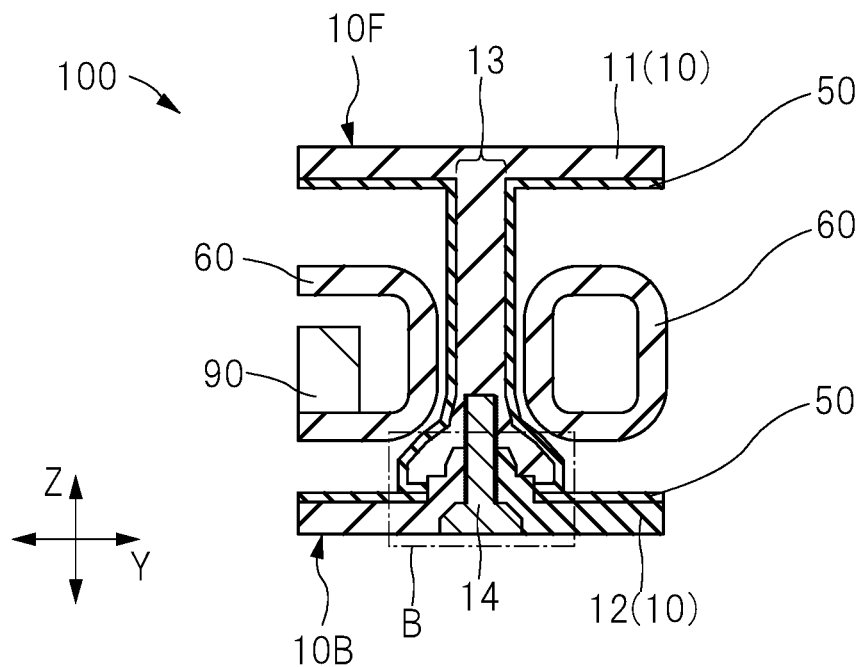
FIG. 5 is an enlarged cross-sectional view showing a structural example of a support portion screwed and fixed by a screw in an enlarged cross section taken along a line B-B of FIG. 4.
Figure 6:
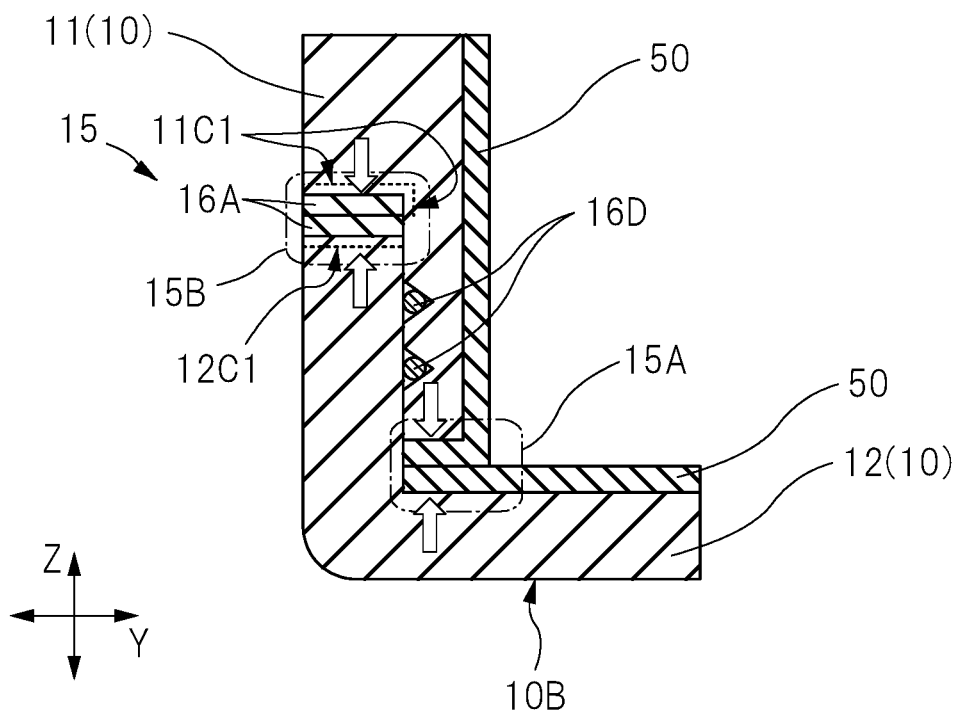
FIG. 6 is an enlarged cross-sectional view of an "A" portion of FIG. 3.
Figure 7:
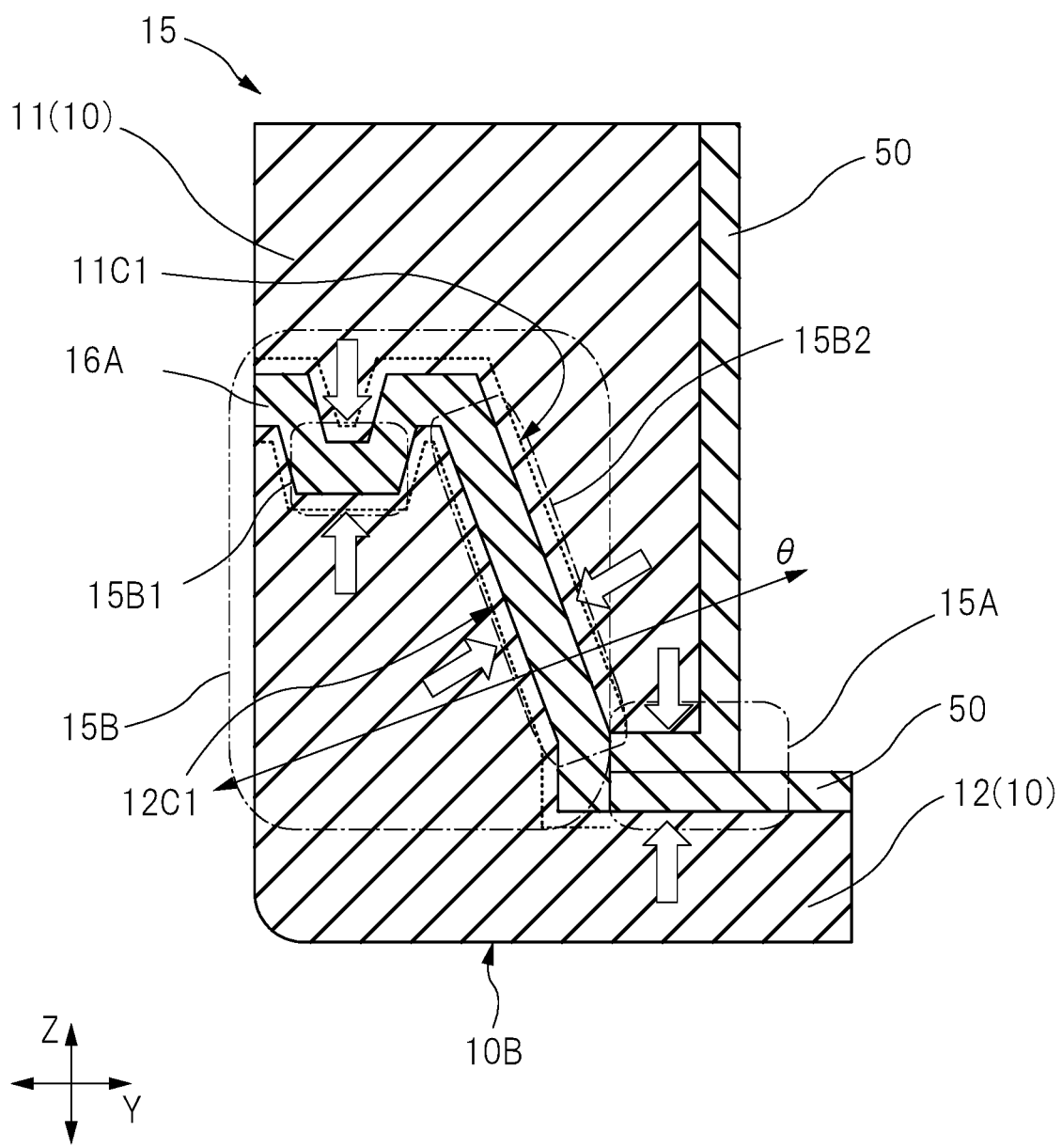
FIG. 7 is an enlarged cross-sectional view showing a modification example of FIG. 6.
Figure 8:
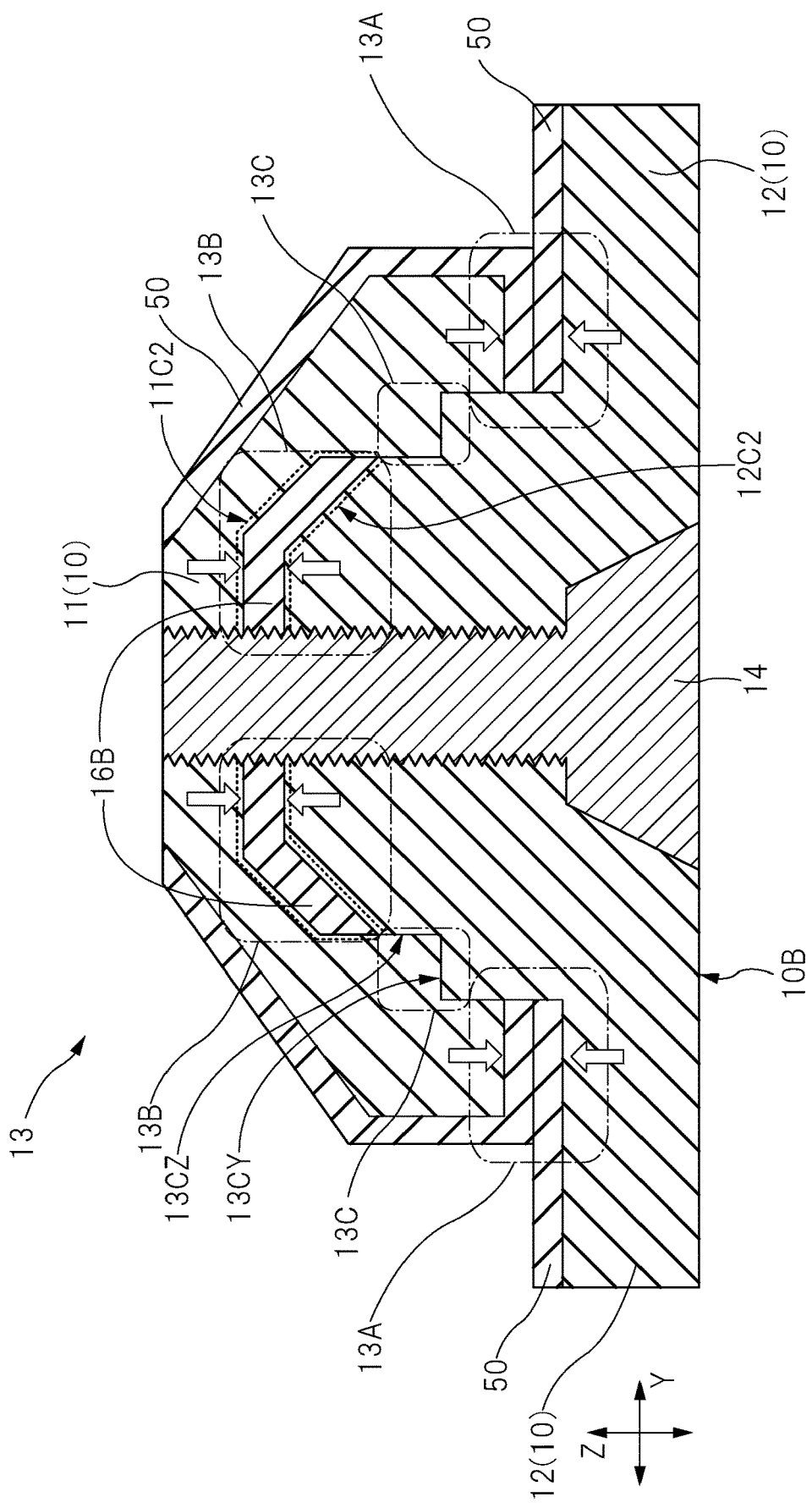
FIG. 8 is an enlarged cross-sectional view of a "B" portion of FIG. 5.
Figure 9:
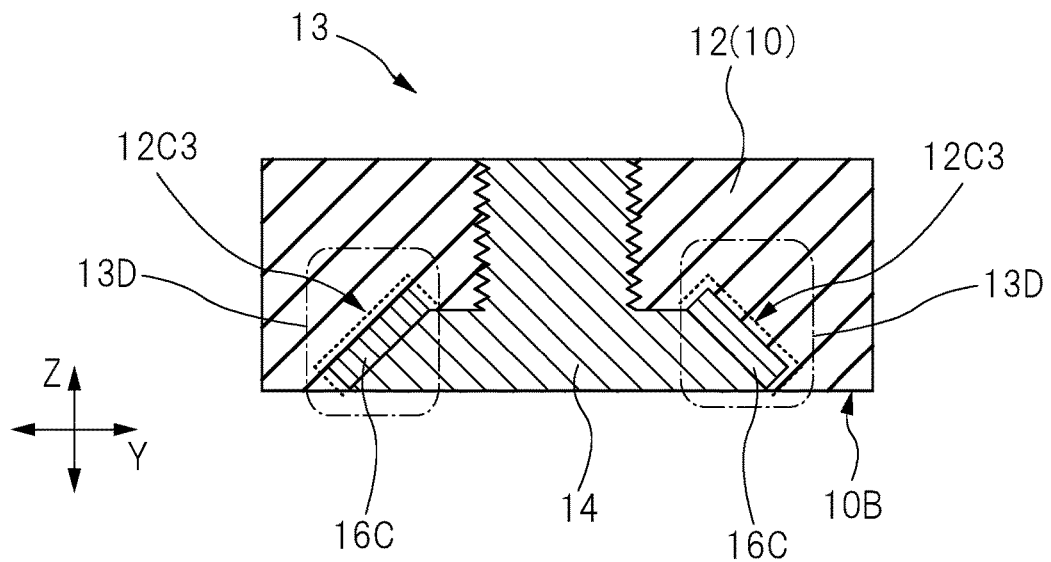
FIG. 9 is a modification example of a structure of a screw shown in FIG. 8.

Next, a sealing structure of the enclosure 10 of the tablet terminal 100 and a heat insulating structure of the heat insulating layer 50 in contact with the enclosure 10 will be explained. FIG. 5 is an enlarged cross-sectional view showing a structure example of the screwed and fixed support portion in an enlarged cross section taken along a line B-B of FIG. 4. FIG. 6 is an enlarged cross-sectional view of an "A" portion of FIG. 3. FIG. 7 is an enlarged cross-sectional view showing a modification example of FIG. 6. FIG. 8 is an enlarged cross-sectional view of a "B" portion of FIG. 5. FIG. 9 is a modification example of a structure of the screw shown in FIG. 8. In FIGS. 6 to 8, a direction of force action in tightening of the screw 14 shown in FIG. 5 is schematically illustrated with an arrow. A surface of the enclosure 10 partially has a coarse-surface region. In FIGS. 6 to 9, the coarse-surface region is schematically illustrated with a dot line.

As shown in FIG. 3, the enclosure 10 has the front surface portion 11 and the back surface portion 12 that are separatable. The front surface portion 11 is a portion to which the display 20 is attached, and a display surface 22 of the display 20 (see FIG. 1) is exposed out from the front surface portion 11 of the enclosure 10. The enclosure 10 is made of a material having stiffness (rigidity). In the sterilizing treatment using the autoclave, the enclosure 10 is exposed to the high-temperature water vapor atmosphere. Therefore, in order to prevent the enclosure 10 itself from being damaged by the high temperature, the material making the enclosure 10 is preferably selected in consideration of the heat resistance, the water resistance (including the vapor resistance), the waterproof property (in other words, sealing property), the pressure resistance, the endurance (the endurance to the number of times of the repetitive usage, the temperature change and others) and others. In consideration of the risk of adhesion of contaminants to the enclosure 10, the material of the enclosure 10 is preferably selected in consideration of antifouling property, easy cleaning property, and resistance to cleaning liquid. As a favorable material in consideration of the endurance, a thermoplastic resin that is so-called Super Engineering Plastics can be exemplified. The super engineering plastics is engineering plastics having the hardness, the heat resistance, the water resistance and others. The enclosure 10 may be made of a material mixed with heat insulating particles. The enclosure 10 may be made of a material containing a reinforced resin made of a glass fiber, a carbon fiber or others. The enclosure 10 or each heat insulating layer may be made of single layer or a plurality of layers.

The enclosure 10 includes: the support portion 13 at which the front surface portion 11 and the back surface portion 12 are fixed to each other by the screw 14 as shown in FIG. 5; and an edge connecting portion 15 at which the front surface portion 11 and the back surface portion 12 are connected to each other in an edge of the enclosure 10 as shown in FIG. 7.

As shown in FIG. 6, the edge connecting portion 15 has a connecting portion 15A at which the front surface portion 11 and the back surface portion 12 face each other so as to sandwich a heat insulating layer 50 therebetween and a connecting portion 15B at which the front surface portion 11 and the back surface portion 12 face each other so as to sandwich a sealing member 16A therebetween. The connecting portion 15B is arranged outside the enclosure 10 to be closer to the outside than the connecting portion 15A. By the tightening force of the screw 14 in the support portion 13 in FIG. 5, the front surface portion 11 and the back surface portion 12 in the connecting portion 15A are fixed so as to sandwich the heat insulating layer 50 therebetween, and the front surface portion 11 and the back surface portion 12 in the connecting portion 15B are fixed so as to sandwich the sealing member 16A therebetween.

When the front surface portion 11 and the back surface portion 12 are configured to be separatable, a portion where a part of the front surface portion 11 and a part of the back surface portion 12 face each other tends to have disconnection (in other words, a heat entry route) of the heat insulating layer 50. In the connecting portion 15A shown in FIG. 6 (and a connecting portion 13A shown in FIG. 8 described later) in the present embodiment, the front surface portion 11 and the back surface portion 12 are fixed so as to sandwich the heat insulating layer 50 therebetween. Because of this, the disconnection of the heat insulating layer 50 can be prevented in the portion where the front surface portion 11 and the back surface portion 12 face each other. As a result, even in the separatable structure of the front surface portion 11 and the back surface portion 12, the reduction in the heat insulating property in the enclosure 10 can be prevented.

Although not illustrated, a tablet terminal having a structure of the enclosure 10 that is not separatable into a plurality of components is exemplified as a modification example of the tablet terminal 100 shown in FIG. 3. In compared to this modification example, in the enclosure 10 made of the separatable front surface portion 11 and back surface portion 12 as described in the present embodiment, assembly and maintenance of the tablet terminal 100 are easier. However, the case of the enclosure 10 having the separatable structure increases the risks of the heat entry and the moisture entry through the portion connecting the front surface portion 11 and the back surface portion 12. Therefore, in the case of the separatable structure, countermeasures for the heat resistance, the water resistance, the chemical resistance, the pressure resistance and others are necessary in the connecting portion.

In the connecting portion 15B in the outer surface region of the enclosure 10 in the example shown in FIG. 6, the sealing member 16A is sandwiched between the front surface portion 11 and the back surface portion 12. In the example shown in FIG. 6, the sealing member 16A has a structure that is separatable into a first sealing member 16A close to the front surface portion 11 and a second sealing member 16A close to the back surface portion 12. However, as a modification example, single sealing member 16A may be sandwiched between the front surface portion 11 and the back surface portion 12 in some cases. The sealing member 16A is made of a material such as a silicon rubber (or silicon resin) having elasticity, and besides, the water resistance and the heat resistance. By the tightening force of the screw 14 (see FIG. 5), the front surface portion 11 and the back surface portion 12 are fixed so as to sandwich the sealing member 16A therebetween. Therefore, the moisture entry can be prevented in the connecting portion 15B outside the enclosure 10. Since the front surface portion 11 and the back surface portion 12 are fixed so as to sandwich the sealing member 16A therebetween, the pressure resistant property of the enclosure 10 can be improved.

Note that FIG. 6 shows an example in which an O-ring 16D interposes between the front surface portion 11 and the back surface portion 12 in the region between the connecting portion 15A and the connecting portion 15B. In order to improve airtightness at a contact boundary between the front surface portion 11 and the back surface portion 12, it is preferable to arrange the O-ring 16D. However, the arrangement of the connecting portion 15B is enough to prevent the moisture entry, and therefore, the O-ring may not be arranged as a modification example of FIG. 6 in some cases.

The following structure is preferable for improving the adhesiveness of the sealing member 16A in the connecting portion 15B with the contact boundary between the front surface portion 11 and the back surface portion 12. That is, in the connecting portion 15B, a surface roughening process is performed to each of a surface 11C1 of the front surface portion 11 in contact with the sealing member 16A and a surface 12C1 of the back surface portion 12 in contact with the sealing member 16A (a portion schematically illustrated with a dot line in FIG. 6). As a method of the surface roughening process, for example, a method of forming small grooves by laser emission to perform a surface modifying process is exemplified. When the material making the enclosure 10 contains the glass fiber or the carbon fiber, a part of the glass fiber or the carbon fiber is exposed out by the laser emission, and the exposed part functions as an anchor for suppressing movement of the sealing member 16A. The sealing member 16A is formed on either one or both of the surface 11C1 of the front surface portion 11 and the surface 12C1 of the back surface portion 12, and the sealing member 16A and the surface on which the sealing member 16A is formed are bonded to each other. When the sealing member 16A is formed on either one of the surface 11C1 of the front surface portion 11 and the surface 12C1 of the back surface portion 12, the method of forming the sealing member 16A includes a modification example in which the surface roughening process is performed to either one (the surface on which the sealing member 16A is formed) of the surface 11C1 and the surface 12C1. In other words, in the connecting portion 15B, if the surface roughening process is performed to at least either one of the surface 11C1 of the front surface portion 11 in contact with the sealing member 16A and the surface 12C1 of the back surface portion 12 in contact with the sealing member 16A, the adhesiveness of the sealing member 16A with the enclosure 10 can be improved.

In the connecting portion 15A close to the inner surface of the enclosure 10 in the example shown in FIG. 6, the heat insulating layer 50 is sandwiched between the front surface portion 11 and the back surface portion 12. The heat insulating layer 50 is a stacked layer including, for example, a heat insulating fiber layer containing a heat insulating fiber and a bonding layer formed on both surfaces so as to sandwich the heat insulating fiber layer therebetween. Alternatively, in place of the staked layer, a sticking layer having adhesiveness may contain the heat insulating fiber in some cases. This stacked layer may include not only the heat insulating fiber layer but also a layer made of a metallic film such as aluminium and a plurality of types of heat insulating fiber layers. As the heat insulating fiber layer, sheet-shaped heat insulating paper or non-flammable fiber formed by adding a resin binder to a fiber material having high heat insulating property can be used. In order to improve the heat insulating property, an inorganic filler such as silica may be added to the heat insulating layer or the bonding layer. In the present embodiment, by the tightening force of the screw 14 (see FIG. 5), the front surface portion 11 and the back surface portion 12 are fixed so as to sandwich the heat insulating layer 50 therebetween. As a result, even if the heat enters from the connecting portion 15B through the connecting boundary between the front surface portion 11 and the back surface portion 12, the heat entry route can be blocked by the connecting portion 15A.

A structure of the edge connecting portion 15 shown in FIG. 6 includes various modification examples. For example, in the modification example shown in FIG. 7, the connecting portion 15B has a facing portion (a first facing portion) 15B1 at which the front surface portion 11 and the back surface portion 12 face each other in a first direction (a Z direction in FIG. 7) parallel to a normal-line direction of the back surface 10B and a second facing portion 15B2 at which the front surface portion 11 and the back surface portion 12 face each other in a second direction (such as a θ direction in FIG. 7) tilting by an angle other than an orthogonal angle from the first direction. As described above, since the connecting portion 15B of the edge connecting portion 15 has the plurality of surfaces crossing one another, the pressure resistance of the enclosure 10 can be improved. This is because a plurality of pressure applying directions are caused when a high pressure is applied to the enclosure 10, and therefore, vectors of the pressure cause opposite forces. In this point of view, an area of the second facing portion 15B2 is preferably large.

Next, a structure of the support portion 13 shown in FIG. 5 will be explained. As described above, in points of view of the waterproof property and the heat resistance of the edge connecting portion 15 of the enclosure 10, the connecting method is not particularly limited if the connecting portion 15A has the structure in which the front surface portion 11 and the back surface portion 12 are fixed to each other so as to sandwich the heat insulating layer 50 therebetween while the connecting portion 15B has the structure in which the front surface portion 11 and the back surface portion 12 are fixed to each other so as to sandwich the sealing member 16A therebetween in the support portion 13 by the tightening force of the screw 14. However, since the front surface portion 11 and the back surface portion 12 are fixed to each other by the screw 14, it is preferable to take a countermeasure for preventing the moisture entry and the heat entry through a screw hole in which the screw 14 is inserted.

As shown in FIG. 8, the support portion 13 has a connecting portion 13A at which the front surface portion 11 and the back surface portion 12 face each other so as to sandwich the heat insulating layer 50 therebetween, a connecting portion 13B at which the front surface portion 11 and the back surface portion 12 face each other so as to sandwich a sealing member 16B therebetween, and a stopper portion 13C arranged between the connecting portion 13A and the connecting portion 13B. The connecting portion 13B is arranged outside the enclosure 10 to be closer to the outside than the connecting portion 13A. By the tightening force of the screw 14, the front surface portion 11 and the back surface portion 12 in the connecting portion 13A are fixed so as to sandwich the heat insulating layer 50 therebetween, and the front surface portion 11 and the back surface portion 12 in the connecting portion 13B are fixed so as to sandwich the sealing member 16B therebetween. Since the same sealing structure and heat insulating structure as those of the edge connecting portion 15 with reference to FIGS. 6 and 7 are adopted to the portion to which the screw 14 is inserted as described above, the moisture entry and the heat entry through the portion to which the screw 14 is inserted can be prevented. Note that the same material as, for example, that of the sealing member 16A explained with reference to FIG. 6 can be used for the sealing member 16B.

Figure 10:
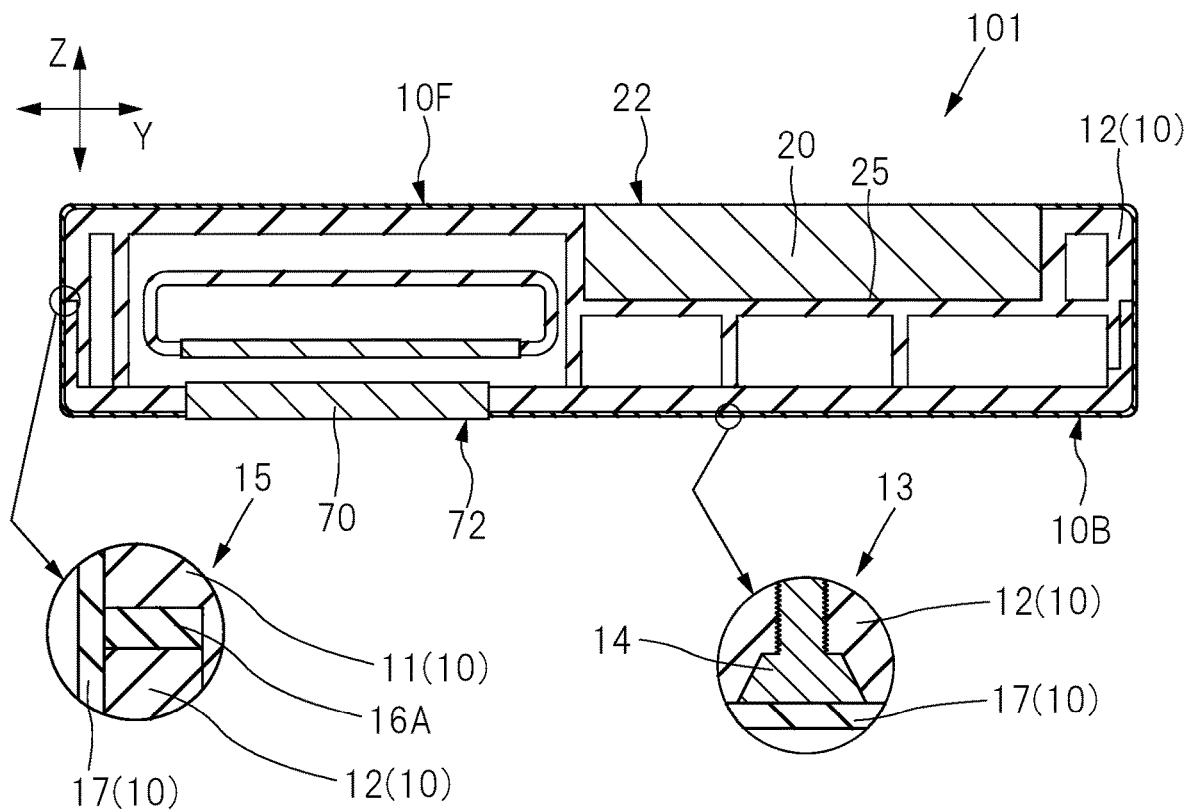
FIG. 10 is a cross-sectional view of a mobile information terminal device according to a modification example of FIG. 3.

The example shown in FIG. 8 has a possibility of the moisture entry through a small gap between the screw 14 and the enclosure 10. However, since the sealing member 16B is arranged between the front surface portion 11 and the back surface portion 12 in the connecting portion 13B at which the front surface portion 11 and the back surface portion 12 are screwed by the screw 14 as shown in FIG. 8, the moisture entry in the connecting portion 13A can be prevented even if the moisture enters. And, a method of preventing the moisture entry is adopted when the sealing member 16C interposes in a boundary between the screw 14 and the back surface portion 12 as shown in FIG. 9 described later. Another method of preventing the moisture entry is adopted when the boundary between the screw 14 and the back surface portion 12 is covered with a cover film 17 that is arranged to cover outer surfaces of the front surface portion 11 and the back surface portion 12 as shown in FIG. 10 described later.

The support portion 13 has the stopper portion 13C controlling positional shift of the front surface portion 11 and the back surface portion 12 in the parallel direction (the Y direction in FIG. 8) to the back surface 10B and the normal-line direction (the Z direction in FIG. 8) of the back surface 10B, in addition to the connecting portion 13A and the connecting portion 13B. The stopper portion 13C has two or more surfaces cross one another. The front surface portion 11 and the back surface portion 12 are directly in contact with each other at each of the two or more surfaces 13CY and 13CZ of the stopper portion 13C. In the example shown in FIG. 8, the stopper portion 13C has the surface 13CY extending in the Y direction and the surface 13CZ extending in the Z direction.

Since the front surface portion 11 and the back surface portion 12 are in contact with each other at the position of the surface 13CY extending in the Y direction in the stopper portion 13C, the positional shift in the thickness direction (the Z direction) of the tablet terminal 100 (see FIG. 5) is controlled. By this positional shift control, the front surface portion 11 and the back surface portion 12 can be prevented from being positionally close to each other at a design value or closer. For example, when the separate distance between the front surface portion 11 and the back surface portion 12 in the Z direction is too small in the connecting portion 13A shown in FIG. 8, a force of sandwiching the heat insulating layer 50 is too large, and this becomes a cause of deterioration of the heat insulating layer 50 due to overload. In the present embodiment, since the front surface portion 11 and the back surface portion 12 are in contact with each other at the surface 13CY of the stopper portion 13C, the separate distance between the front surface portion 11 and the back surface portion 12 in the connecting portion 13A can be maintained at a predetermined suitable value. As a result, the deterioration of the heat insulating layer 50 due to overload can be suppressed. The deterioration of the material due to the sandwiching by the excessive force may be caused even in the sealing member 16B. The sealing member 16B is, for example, an elastic material, and stress can be moderated by elastic deformation if a displacement amount is suitable. However, if the displacement amount is excessive, even the elastic material becomes the cause of the deterioration. In the present embodiment, since the front surface portion 11 and the back surface portion 12 are in contact with each other at the surface 13CY of the stopper portion 13C, the separate distance between the front surface portion 11 and the back surface portion 12 in the connecting portion 13B can be maintained at a predetermined suitable value. As a result, the deterioration of the sealing member 16B due to overload can be suppressed.

Since the front surface portion 11 and the back surface portion 12 are in contact with each other at the surface 13CZ extending in the Z direction in the stopper portion 13C, the positional shift in the direction (the Y direction in the example of FIG. 8) crossing the thickness direction of the tablet terminal 100 (see FIG. 5) is controlled. In other words, while a protrusion of the back surface portion 12 is inserted into the opening of the support portion 13 of the front surface portion 11 by the tightening force of the screw 14, the surface 13CZ is functioned as a guide by the contact between the front surface portion 11 and the back surface portion 12 at the surface 13CZ of the stopper portion 13C. As a result, the positional shift between the front surface portion 11 and the back surface portion 12 in the direction crossing the thickness direction of the tablet terminal 100 (see FIG. 5) can be prevented by the stopper portion 13C.

In the connecting portion 13B, a surface roughening process is performed to each of a surface 11C2 of the front surface portion 11 in contact with the sealing member 16B and a surface 12C2 of the back surface portion 12 in contact with the sealing member 16B. This surface roughening process is the same as the surface roughening process explained with reference to FIG. 6. By the surface roughening process, the bonding strength of the sealing member 16B with the front surface portion 11 and the back surface portion 12 can be improved. When a rubber washer is used as the sealing structure, distortion may be caused by twist of the rubber washer. The method of the surface roughening process as described in the present embodiment can prevent the occurrence of such distortion, and therefore, the performances in the point of view of the sealing property and the endurance can be improved. When the sealing member 16B is formed on either one of the surface 11C2 of the front surface portion 11 and the surface 12C2 of the back surface portion 12, the method of forming the sealing member 16B includes a modification example of the surface roughening process performed to either one (the surface on which the sealing member 16B is formed) of the surface 11C2 and the surface 12C2. In other words, in the connecting portion 13B, if the surface roughening process is performed to at least either one of the surface 11C2 of the front surface portion 11 in contact with the sealing member 16B and the surface 12C2 of the back surface portion 12 in contact with the sealing member 16B, the adhesiveness between the sealing member 16B and the enclosure 10 can be improved.

The method of preventing the moisture entry from the portion to which the screw 14 is inserted includes a modification example shown in FIG. 9. In the modification example shown in FIG. 9, the support portion 13 includes a screw sealing portion 13D at which the screw 14 and the back surface portion 12 face each other to sandwich a sealing member 16C therebetween. In the screw sealing portion 13D, the surface roughening process is performed to a surface 12C3 of the back surface portion 12 in contact with the sealing member 16C. Since the sealing member 16 interposes between the screw 14 and the back surface portion 12 in the screw sealing portion 13D, the moisture entering through a gap between the screw 14 and the back surface portion 12 can be prevented at the minimum. As a material of the sealing member 16C, for example, the same material as that of the sealing member 16A explained with reference to FIG. 6 can be used. Although not illustrated, there is also a modification example of performing the surface roughening process to a surface of the screw 14 adhering to the sealing member 16C. In this example, adhesiveness between the screw 14 and the sealing member 16C can be improved, and therefore, the moisture entry through a boundary between the screw 14 and the sealing member 16C can be further reliably prevented.

In order to increase a contact area between the screw 14 and the sealing member 16C, the surface of the screw 14 in contact with the sealing member 16C is preferably a surface inclining to the back surface 10B. And, in order to prevent bacterial and viral entry, the sealing member 16C is preferably as close as possible to an inlet of the screw hole formed in the back surface portion 12. For example, the sealing member 16C is in contact with a screw head of the screw 14, the screw head being closer to the back surface 10B than a portion having screw threads.

FIG. 10 is a cross-sectional view of a mobile information terminal device in a modification example of FIG. 3. A tablet terminal 101 shown in FIG. 10 is different from the tablet terminal 100 shown in FIG. 3 in that the enclosure 10 includes the cover film 17. The enclosure 10 includes the cover film 17 covering outer surfaces of the front surface portion 11 and the back surface portion 12. At least the sealing member 16A of the edge connecting portion 15 and the screw 14 (specifically the screw head of the screw 14) of the support portion 13 are covered with the cover film 17.

The cover film 17 is made of a material such as silicon rubber (or silicon resin) having light transparency, heat resistance, water resistance, flexibility (elasticity) and others. The cover film 17 preferably further has a property such as endurance, wear resistance, pressure resistance, easy cleaning property, or others. Since the opening communicating with the internal space of the enclosure 10 is covered with the cover film 17, the moisture entry through the opening can be prevented. In the example shown in FIG. 10, each of the display surface 22 of the display 20 and the heat release surface 72 of the heat release mechanism 70 is exposed out from the cover film 17. As a modification example, a structure in which the entire outermost periphery of the tablet terminal 101 is covered with the cover film 17 is also exemplified. For example, when the cover film 17 is made of a material that is transparent to visible light, the light can penetrate even if the display surface 22 is covered with the cover film 17. However, in order to improve the heat release property, at least a part of the heat release surface 72 is preferably exposed out from the cover film 17.

Meanwhile, in order to open the enclosure 10 for easily repairing or replacing the internal component, the entire enclosure 10 is preferably uncovered with the cover film 17.

In the present embodiment, note that the connecting method using the screw 14 has been explained as one example of the connecting method (fixing method) between the front surface portion 11 and the back surface portion 12. However, various modification examples are applicable as the connecting method. For example, a bonding method based on fusion welding, casting, chemical conversion coating, compression bonding using a bonding material, or others is applicable although not illustrated.

The explained structures in the present section with reference to FIGS. 5 to 10 are applicable to electronic equipment not without the heat release mechanism 70, the heat release mechanism 80 and the heat insulating layer 60 as a modification example of the tablet terminal 100 shown in FIG. 3.

<Structure Example of Heat Release Mechanism>

Figure 11:
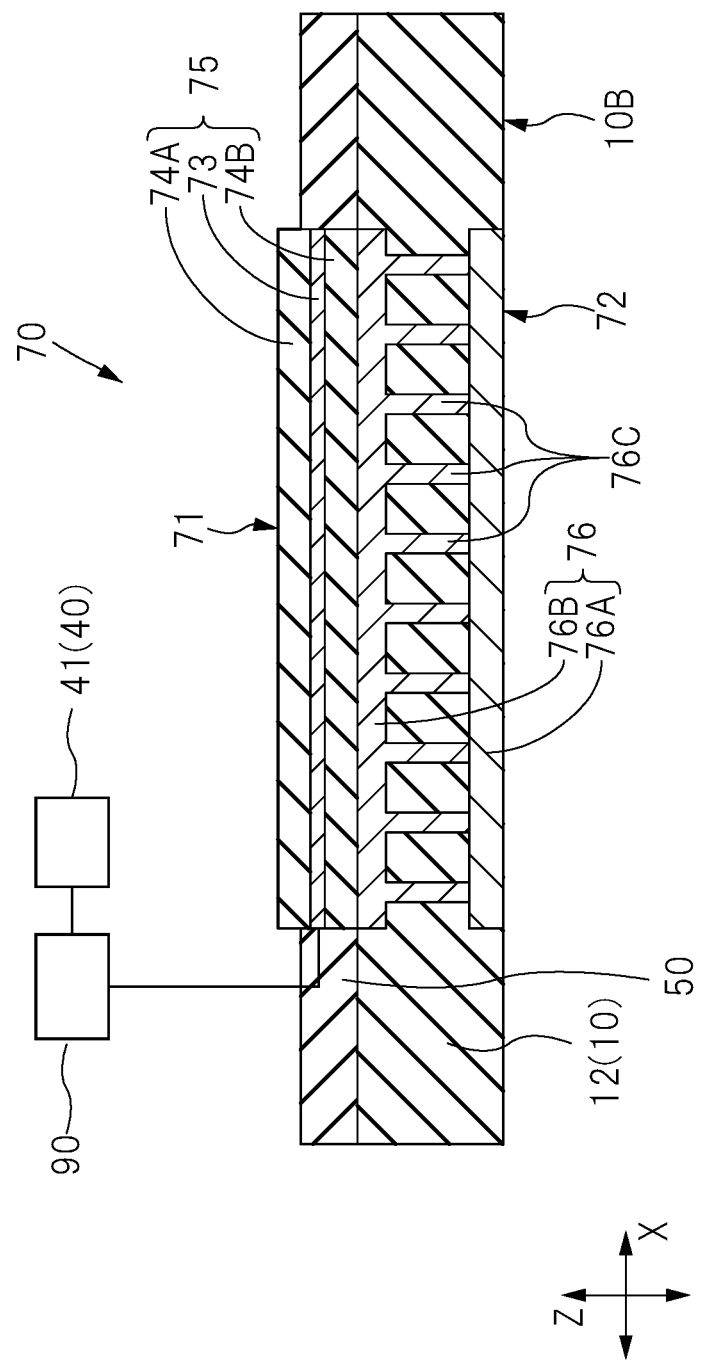
FIG. 11 is an enlarged cross-sectional view showing a structural example of a heat release mechanism shown in FIG. 3.
Figure 12:
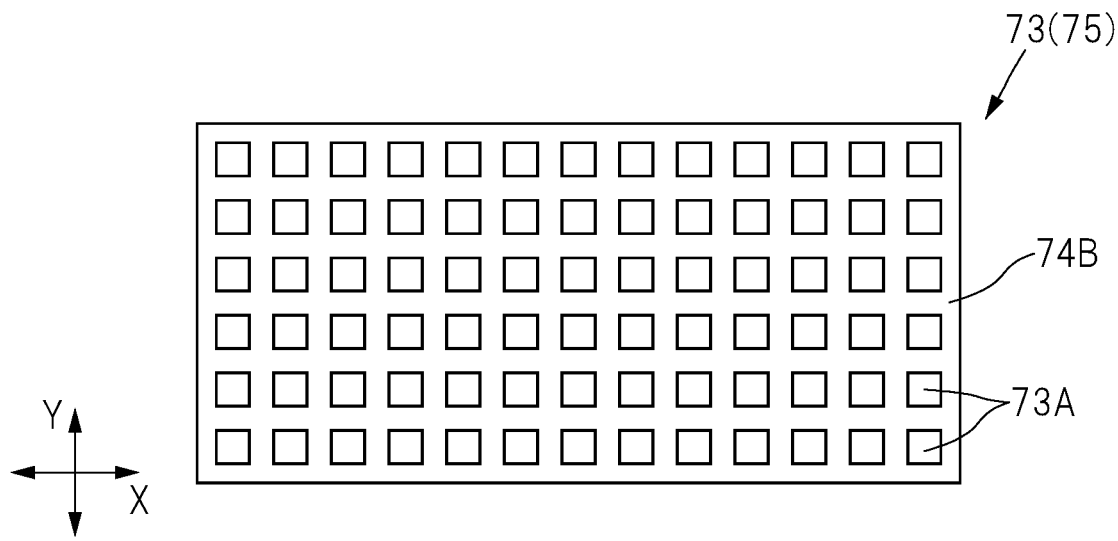
FIG. 12 is a plan view showing one example of a layout of a plurality of Peltier elements in an array formation in a Peltier element layer shown in FIG. 11.

Next, structure examples of the heat release mechanisms 70 and 80 shown in FIG. 3 will be explained. Various mechanisms are applicable as each of the heat release mechanisms 70 and 80 shown in FIG. 3 if the mechanism has the property of discharging the heat from the region of the heat absorbent surface to the region of the heat release surface and the property of suppressing the heat transmission from the region of the heat release surface to the region of the heat absorbent surface. Also, it is particularly preferable to electrically control a degree of the heat release and a heat release state if possible. In the present embodiment, a heat release mechanism using the Peltier effect will be explained as an example of the heat release mechanism having the heat release property as described above and being capable of electrically controlling the degree of the heat release and the heat release state. In the present section, note that the heat release mechanism 70 will be exemplified and explained as a typical example since the heat release mechanisms 70 and 80 can take the same structure as each other. The heat release mechanism 80 includes a Peltier sheet module 75 made of a Peltier element layer 73 and ceramic plates 74A and 74B sandwiching the Peltier element layer as similar to the heat release mechanism 70. FIG. 11 is an enlarged cross-sectional view showing the structure example of the heat release mechanism shown in FIG. 3. FIG. 12 is a plan view showing one example of a layout in the Peltier element layer shown in FIG. 11 in which a plurality of Peltier elements are arranged in an array form.

The heat release mechanism 70 shown in FIG. 11 includes the Peltier element layer 73 in which the plurality of Peltier elements 73A are arranged in the array form (see FIG. 12). Specifically, the heat release mechanism 70 includes a Peltier sheet module 75 and a heat release member 76. The Peltier sheet module 75 includes the ceramic plate 74A having a heat absorbent surface 71, the Peltier element layer 73, and the ceramic plate 74B that is opposite to the ceramic plate 74A to interpose the Peltier element layer 73 therebetween. A heat release member 76 includes a heat release plate 76A having a heat release surface 72 exposed out from the enclosure 10, and a heat guide member 76B arranged between the heat release plate 76A and the Peltier sheet module 75 and thermally connected to each of the ceramic plate 74B and the heat release plate 76A.

As shown in FIG. 12, the plurality of Peltier elements 73A configure, for example, a Peltier element array arrayed on a matrix form. The plurality of Peltier elements 73A are electrically connected to one another. The plurality of Peltier elements 73A are mounted on the ceramic plate 74B so that one surface (heat absorbent surface) of the Peltier element 73A is in contact with the ceramic plate 74A while its opposite surface (heat release surface) is in contact with the ceramic plate 74B. Between the ceramic plates 74A and 74B, the plurality of Peltier elements 73A are sealed with a sealing member such as a resin.

As schematically shown in FIG. 11, the Peltier element layer 73 is electrically connected to the secondary battery 90. The secondary battery 90 is electrically connected to the data processor component 41, and power supply to the Peltier element layer 73 is turned ON/OFF by a command signal output of the data processor component 41. During the power supply to the Peltier element layer 73, the heat is absorbed through the heat absorbent surface 71, and the heat is released out through the heat release surface 72. By such electrical control of the heat release state of the heat release mechanism 70, the power consumption in the entire device can be reduced. For example, at the time of usage of the tablet terminal 100 (see FIG. 1), the ON/OFF state of the heat release mechanism 70 (and the heat release mechanism 80) is controlled based on a temperature of the electronic circuit component 40 to be detected. When the sterilizing treatment using the autoclave needs to be performed, the heat entry through the heat release mechanism 70 can be prevented by the power supply to the heat release mechanism 70 (and the heat release mechanism 80). As described above, in the present embodiment, the operation state of the heat release mechanism 70 is controlled by the data processor component 41 that is one of the plurality of electronic circuit components 40 shown in FIG. 4. Therefore, when the sterilizing treatment using the autoclave does not need to be performed and the tablet terminal 100 is not used, the power supply to the heat release mechanism 70 can be stopped, and therefore, the entire power consumption can be reduced.

As the material for making the heat release mechanism 70, a material having higher thermal conductivity than those of the materials for making the enclosure 10 and the heat insulating layer 50 can be used. However, the electronic circuit component 40 inside the enclosure 10 can be prevented from being damaged by the heat influence since the direction of the heat transmission can be controlled by the operation of the heat release mechanism 70.

Incidentally, the function of the heat release mechanism 70 can be achieved only by the Peltier sheet module 75. However, in order to prevent malfunction of the Peltier sheet module 75 due to the moisture, a structure shown in FIG. 11 is preferable. Specifically, a heat release member 76 is attached to the enclosure 10, and the Peltier sheet module 75 is attached into the enclosure 10. The heat release member 76 is embedded in the enclosure 10. In an example shown in FIG. 11, the heat release member 76 has a structure in which two plate-like members are connected through a plurality of pillars 76C arranged between the two plate-like members. The material for making the enclosure 10 are embedded in peripheries of the plurality of pillars 76C. In such a structure, a structure shown in FIG. 11 in which the plurality of pillars 76C are molded in the enclosure 10 is formed by, for example, manufacturing a structure of the heat release member 76, and then, performing insertion molding of the material of the enclosure 10 to seal the pillars 76C of the heat release member 76. In this structure, the Peltier sheet module 75 is arranged inside the enclosure 10, and therefore, the malfunction of the Peltier element 73A (see FIG. 12) due to the moisture influence or the deformation caused by the pressure can be prevented. And, since the heat release member 76 is attached to the enclosure 10 to be embedded therein, the moisture entry into the enclosure 10 can be suppressed.

The example shown in FIG. 11 shows that the heat release plate 76A and the heat guide member 76B are made as a different member as an example. In this case, the heat release plate 76A and the heat guide member 76B can be made of a different material from each other. For example, the heat guide member 76B is made of aluminium or others in consideration of the heat conductivity, and the heat release plate 76A, a part of which is exposed out of the enclosure, is made of a stainless steel or others in consideration of corrosion resistance. However, as a modification example, the heat release plate 76A and the heat guide member 76B may be made of the same material to be united.

<Countermeasures to Near-Infrared Rays>

Next, countermeasures for preventing entry of the near-infrared rays that is one cause of increase in the internal temperature of the enclosure 10 will be explained. The heat entry into the enclosure 10 can be prevented by the structure explained above in the section <Heat Insulating Structure and Sealing Structure>. However, according to the studies of the inventors of the present application, it has been found that the entry of the near-infrared rays from outside into the enclosure 10 possibly increases the temperature because the component arranged inside the enclosure 10 is heated by the near-infrared rays. In the sterilizing treatment using the autoclave, inside of a pressure vessel may be directly heated by, for example, a heater in some cases. In this case, a wavelength band of the near-infrared rays emitted from the heater has wavelengths of about 0.7 to 2.5 As a modification example of the tablet terminal 100, a preferable aspect of the countermeasures to the near-infrared rays will be explained below.

Figure 13:
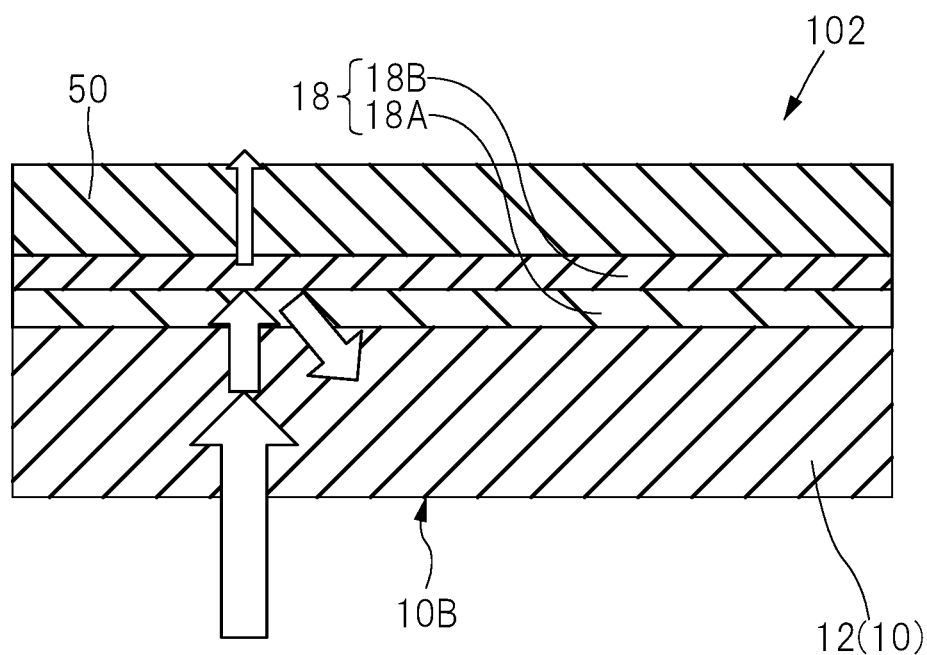
FIG. 13 is an enlarged cross-sectional view showing one example of a peripheral structure of an enclosure in a mobile information terminal device according to another modification example of FIG. 3.
Figure 14:
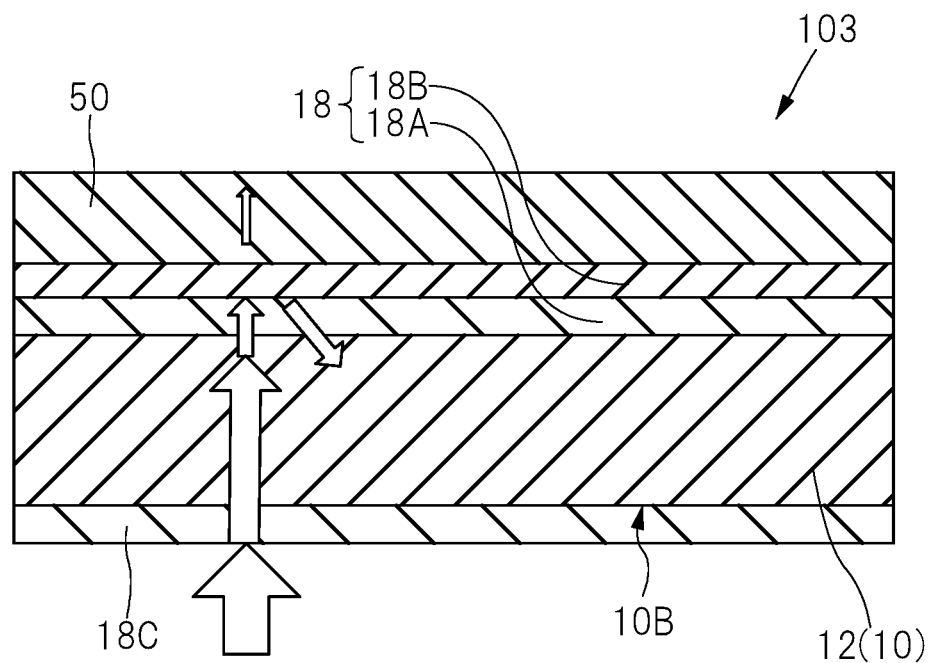
FIG. 14 is a modification example of FIG. 13.

In attention paid to the heating of the component due to the near-infrared rays, even when the heat insulating layers 50 and 60 shown in FIG. 3 are arranged, the internal component is heated if the near-infrared rays penetrate. Accordingly, in the present modification example, a structure example including a functional layer for use in preventing the entry of the near-infrared rays will be explained. FIG. 13 is an enlarged cross-sectional view showing one example of a peripheral structure of an enclosure of a mobile information terminal device of another modification example of FIG. 3. FIG. 14 is a modification example of FIG. 13.

A tablet terminal 102 of the modification example shown in FIG. 13 is different from the tablet terminal 100 shown in FIG. 3 in that a near-infrared shielding layer 18 for blocking the entry of the near-infrared rays is arranged between the enclosure 10 and the heat insulating layer 50. The near-infrared shielding layer 18 is made of a near-infrared absorbent layer 18A having higher near-infrared absorption than that of the enclosure 10 and a near-infrared reflection layer 18B having higher near-infrared reflectance than that of the enclosure 10, that are arranged in this order from the region of the enclosure 10.

For example, a case of emission of the near-infrared rays from the region of the back surface 10B as schematically shown with an arrow in FIG. 13 will be considered. The near-infrared rays penetrate the enclosure 10, and is absorbed by the near-infrared absorbent layer 18A. Most of the near-infrared rays not absorbed by the near-infrared absorbent layer 18A are reflected by the near-infrared reflection layer 18B. As a result, an amount of the near-infrared rays reaching the heat insulating layer 50 arranged inside the near-infrared shielding layer 18 can be reduced. Energy absorbed by the near-infrared absorbent layer 18A is converted into heat energy. In other words, the near-infrared absorbent layer 18A is heated. The temperature inside the pressure vessel does not rise to a predetermined temperature (for example, 137° C. in a case of a class-B autoclave) or higher, and therefore, the reflected heat disperses out of the region of the back surface 10B. Meanwhile, the heat generated in the near-infrared absorbent layer 18A is insulated by the heat insulating layer 50, and therefore, the heat entry into the heat insulating layer 50 can be suppressed. As described above, the present modification example can suppress the entry of the near-infrared rays from the outside. In attention paid to the fact that the near-infrared absorbent layer 18A tends to be heated, the emission of the near-infrared rays to the tablet terminal 102 in the sterilizing treatment using the autoclave can improve the efficiency of the sterilizing treatment on a surface of the tablet terminal 102.

FIG. 13 shows the example of the countermeasures to the near-infrared rays in the outer region of the heat insulating layer 50. However, the near-infrared shielding layer 18 shown in FIG. 13 may be arranged in the outer region of the heat insulating layer 60 shown in FIG. 3 in some cases. In this case, the internal component of the heat insulating layer 60 can be prevented from being heated by the near-infrared rays penetrating the heat insulating layer 50.

As seen in a tablet terminal 103 of a modification example shown in FIG. 14, the back surface 10B of the enclosure 10 may be covered with a near-infrared absorbent layer 18C in some cases. And, FIG. 14 shows an enlarged view of a periphery of the back surface 10B, and the entire enclosure 10 may be covered with the near-infrared absorbent layer 18C in some cases. The near-infrared absorbent layer 18C is made of the same material as that of the near-infrared absorbent layer 18A. In this case, the sterilizing effect on the back surface 10B can be further improved.

As an example of the material for making the near-infrared absorbent layers 18A and 18C, a film made of carbon black can be exemplified. As a the near-infrared reflection layer, a film made of titanium oxide can be exemplified. When the near-infrared absorbent layer 18C is provided with the carbon black, it is preferable to arrange a surface protection film (see, for example, the cover film 17 in FIG. 10) for covering the near-infrared absorbent layer 18C in order to suppress the damage of the carbon black.

While FIGS. 13 and 14 show one example of the countermeasures to the near-infrared rays, various modification examples are applicable. For example, a structure example without the near-infrared absorbent layer 18A in the structure shown in FIG. 14 is exemplified. Alternatively, a near-infrared absorbent material such as the carbon black may be mixed with the enclosure 10 so that the enclosure 10 itself functions as a near-infrared absorbent member. In this case, either one or both of the near-infrared absorbent layers 18A and 18C can be eliminated. Alternatively, the near-infrared reflection layer 18B may be arranged between the near-infrared absorbent layer 18C and the enclosure 10. In this case, the near-infrared shielding layer 18 between the enclosure 10 and the heat insulating layer 50 can be eliminated. However, in this case, the near-infrared absorbent layer 18C needs to sufficiently absorb the heat before the heat is transmitted to the near-infrared reflection layer 18B.

As a modification example of the tablet terminal 100 shown in FIG. 3, each feature portion of the structure explained in the present section with reference to FIGS. 13 and 14 is applicable to electronic equipment without the heat release mechanism 70, the heat release mechanism 80 and the heat insulating layer 60.

<Display>

Figure 15:
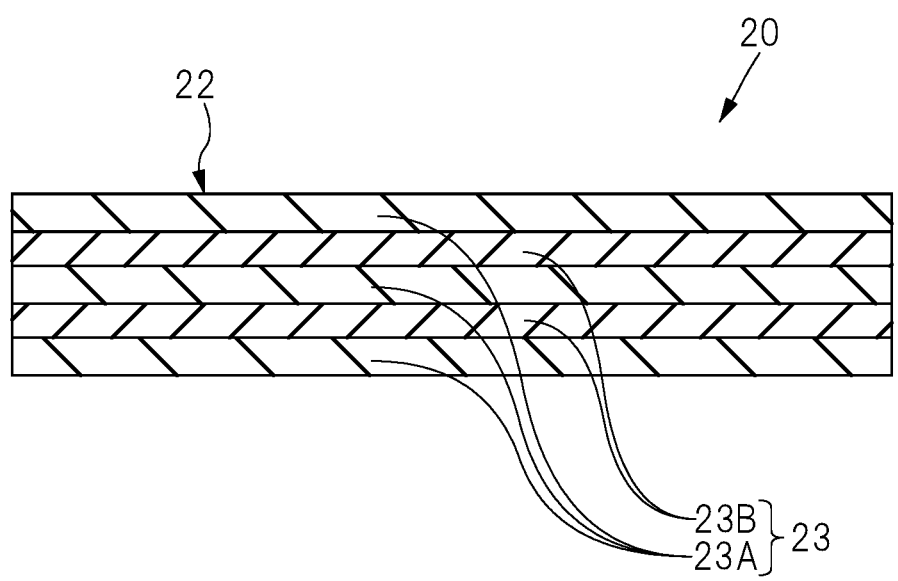
FIG. 15 is an explanatory diagram showing a configurational example of a transparent substrate having a display surface in a display shown in FIG. 11.

Next, countermeasures in the display 20 shown in FIG. 11 for insulating the heat will be explained. As shown in FIG. 11, the display surface 22 of the display 20 is exposed out from the enclosure 10. The display surface 22 needs to have the visible-light transparency, and therefore, option of its material is limited. A preferable configuration of the display in consideration of the heat insulation, the water resistance, the heat resistance, the pressure resistance, the chemical resistance, the wear resistance or others will be explained below. FIG. 15 is an explanatory diagram showing a configurational example of a transparent substrate having the display surface in the display shown in FIG. 11.

The display 20 shown in FIG. 11 includes a transparent substrate 23 (see FIG. 15) having the display surface 22 and the visible-light transparency. As shown in FIG. 15, the transparent substrate 23 includes a plurality of transparent resin layers 23A and a silica film layer 23B sandwiched between the plurality of transparent resin layers 23A and containing a plurality of silica particles. The transparent resin layer 23A and the silica film layer 23B are alternately stacked. The transparent resin layer 23A has the heat resistance so as not to be modified at a heating treatment temperature (such as 134° C.) of the autoclave or lower. The silica film layer 23B has the higher heat insulation than that of the transparent resin layer 23A. In other words, the transparent substrate 23 has a stacked-layer structure made of a heat insulating film and a heat resistant film. By this configuration, the heat entry through the transparent substrate 23 can be suppressed. Note that FIG. 15 shows one example with three transparent resin layers 23A and two silica film layers 23B. However, various modification examples are applicable. For example, as the minimum configuration, a configuration with two transparent resin layers 23A and one silica film layer 23B is exemplified. Alternatively, a case with the transparent resin layers 23A that is more than three and the silica film layers 23B that is more than two is exemplified.

A silica film for making the silica film layer 23B is a plate-like member capable of having both the high transparency and the high heat insulation. The higher a ratio of a silica component contained in the silica film is, the more the improvement of the heat insulation is. On the other hand, a mechanical strength of the silica film is not so high. In the present embodiment, as shown in FIG. 10, a concave portion 25 for housing the display 20 is formed in the enclosure 10 (more specifically, the front surface portion 11 of the enclosure 10). The display 20 is embedded into the concave portion 25 of the enclosure 10. In this structure, the display 20 is supported by the enclosure 10. Therefore, even if the pressure is applied to the display 20, deformation and functional deterioration of the display 20 can be prevented.

In order to cause the display 20 to display images and videos, it is necessary to electrically drive the display 20. The electronic circuit component 40 (in the present embodiment, the data processor component 41 shown in FIG. 4) for driving this display 20 is preferably arranged inside the heat insulating layer 60. In this manner, even if the heat enters through the transparent substrate 23, the heat can be blocked by the heat insulating layer 60.

In the example shown in FIG. 1, note that a size of the display surface 22 has an area that is, for example, equal to or smaller than a half of a planar area of the front surface 10A of the enclosure 10 (see FIG. 3) as different from the case of the electronic equipment such as the regular tablet terminal and smartphone. The reason for this is as follows: Specifically, a volume or a thickness of the portion with the display surface 22 inside the enclosure 10 is small in order to make the heat insulating structure reliable to be against the high temperature in the sterilizing treatment using the autoclave. If the display surface 22 is large, this device is difficult to be used since its thickness increases by this large size. Therefore, the enhanced heat insulating structure is built in a portion without the display surface 22 because of the small display surface 22, and the electronic circuit component or others is housed in this portion to be protected from the heat. However, the tablet terminal 101 is thinned while the size of the display surface 22 is increased because of the improvement of the heat insulating technique and the heat insulation of the electronic equipment, and therefore, the equipment is expected to be easily used. Thus, the thickness of the tablet terminal 100, the size of the display surface 22 and others are merely examples, and they are not limited to these examples.

Figure 16:
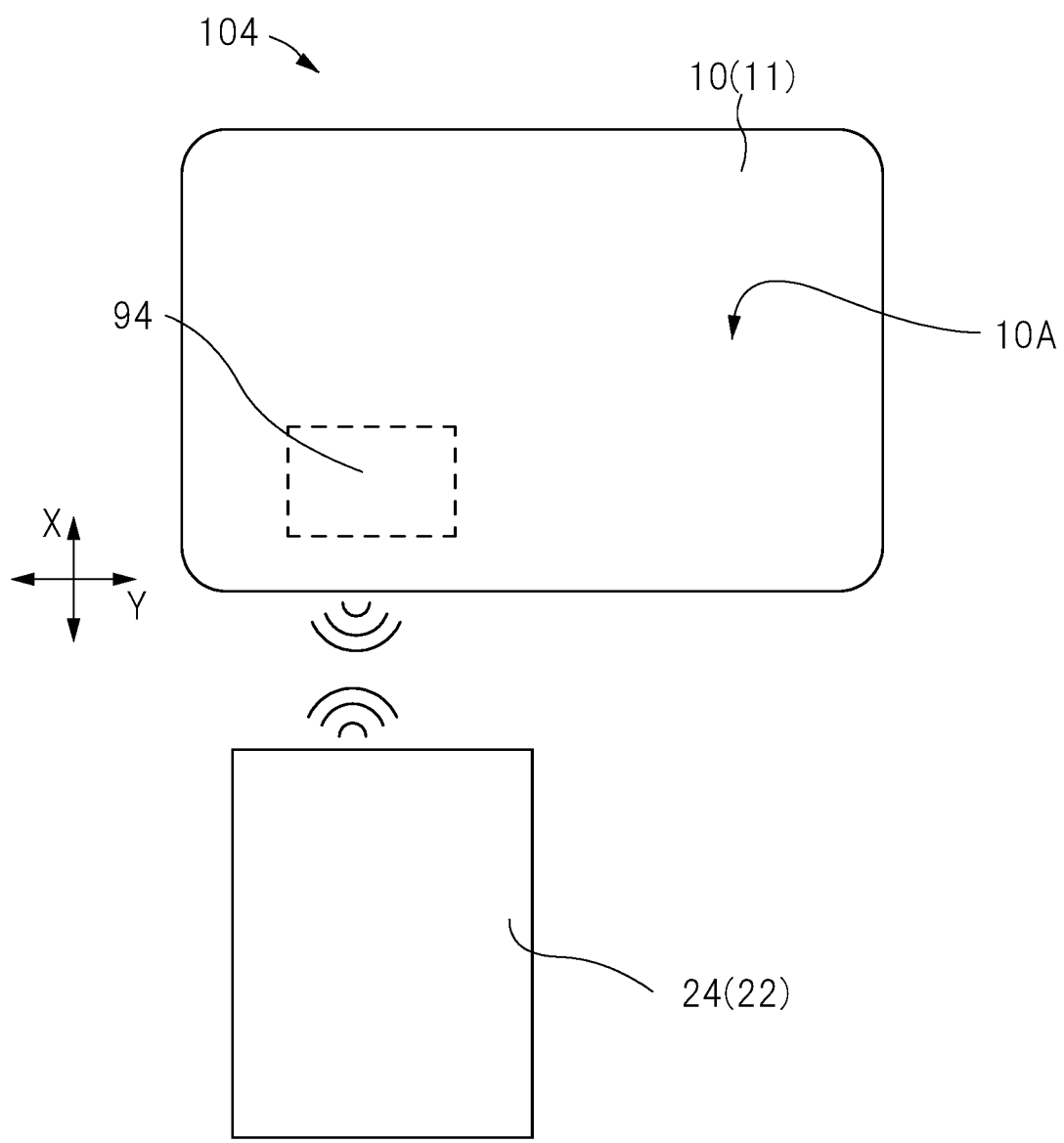
FIG. 16 is a plan view showing a modification example of FIG. 1.

As another modification example of the display 20, an aspect shown in FIG. 16 is exemplified. FIG. 16 is a plan view showing a modification example of FIG. 1. A tablet terminal 104 shown in FIG. 16 is different from the tablet terminal 100 shown in FIG. 1 in that the tablet terminal 104 does not include the display 20 shown in FIG. 1. In the tablet terminal 104, a communication circuit 94 wirelessly communicating with an external device is included in the enclosure 10. When a command is input by making contact of a finger or an input tool to the front surface 10A of the tablet terminal 100, a signal corresponding to the command is output to an external display device 20 through the communication circuit 94. As a result, an image or a video corresponding to the command is output to the display surface 22 of the display device 24. As shown in FIG. 16, this modification example does not include the display surface 22 exposed out from the enclosure 10, and therefore, the heat insulating structure of the enclosure can be enhanced.

Each feature portion of the structure explained in the present section with reference to FIGS. 10, 15 and 16 is applicable to electronic equipment without the heat release mechanism 70, the heat release mechanism 80 and the heat insulating layer 60 as the modification example of the tablet terminal 100 shown in FIG. 3.

Another Modification Example

Figure 17:
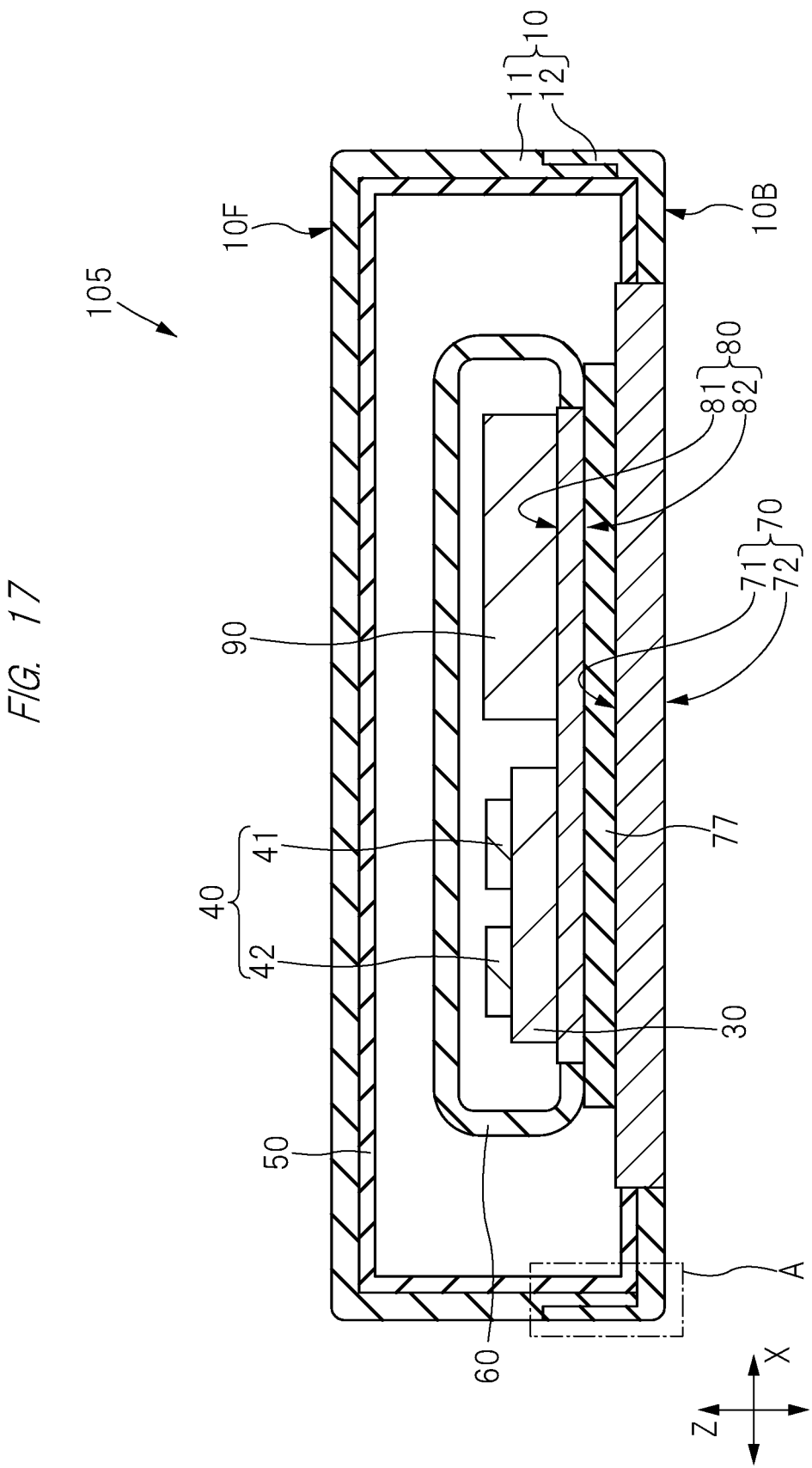
FIG. 17 is a cross-sectional view of a mobile information terminal device according to another modification example of FIG. 3.

Next, some typical modification examples other than the above-described embodiments and various modification examples will be explained. FIG. 17 is a cross-sectional view of a mobile information terminal device according to another modification example of FIG. 3. A tablet terminal 105 shown in FIG. 17 is different from the tablet terminal 100 shown in FIG. 1 in that the heat release mechanism 70 and the heat release mechanism 80 are thermally connected to each other through a ceramic substrate (heat guide plate) 77. The ceramic substrate 77 is in contact with each of the heat absorbent surface 71 of the heat release mechanism 70 and the heat release surface 82 of the heat release mechanism 80. This manner improves the thermal efficiency that release the heat in the heat insulating layer 60 to the outside of the enclosure 10. In consideration of the countermeasures to the heating by the near-infrared rays, note that the guide plate that thermally connects the heat release mechanism 70 and the heat release mechanism 80 is preferably made of a material other than a metallic material. However, in consideration of the heat release property, the ceramic substrate 77 may be replaced with the metallic heat guide plate in some cases.

Figure 18:
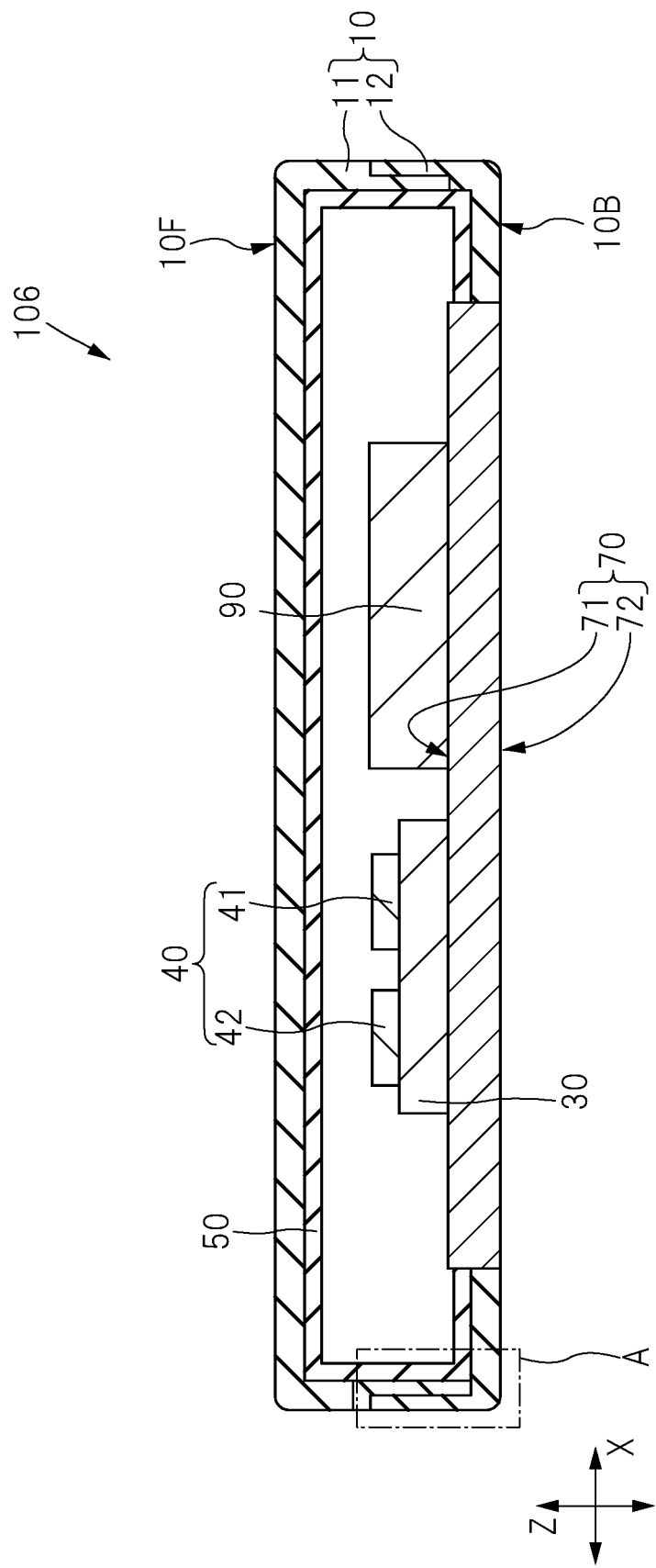
FIG. 18 is a cross-sectional view showing a mobile information terminal device according to another modification example of FIG. 3.

FIG. 18 is a cross-sectional view showing a mobile information terminal device according to another modification example of FIG. 3. A tablet terminal 106 shown in FIG. 18 is different from the tablet terminal 100 shown in FIG. 1 in that this tablet terminal 106 does not include the heat insulating layer 60 and the heat release mechanism 80 shown in FIG. 3. If the sufficient heat insulation can be achieved by the heat insulating layer 50 and the heat release mechanism 70, the heat insulating layer 60 shown in FIG. 1 may not be arranged in some cases. In this case, the secondary battery 90 and the substrate 30 are preferably mounted on the heat absorbent surface 71 of the heat release mechanism 70.

Figure 19:
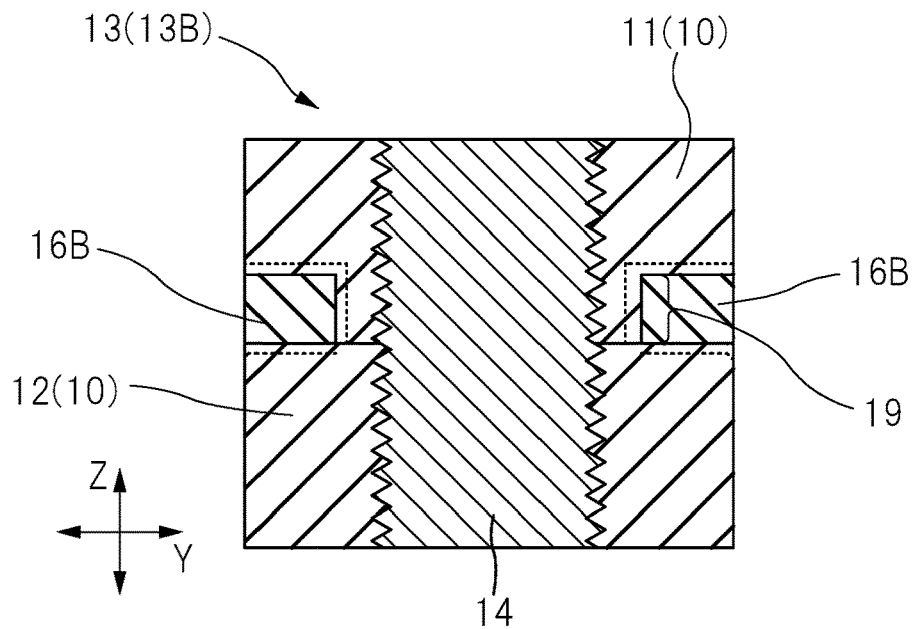
FIG. 19 is an enlarged cross-sectional view showing a modification example of periphery of a connecting portion between a front surface portion and a back surface portion shown in FIG. 8.

FIG. 19 is an enlarged cross-sectional view showing a modification example of a periphery of a connecting portion between the front surface portion and the back surface portion shown in FIG. 8. A connecting portion 13B shown in FIG. 19 is different from that of the aspect shown in FIG. 8 in that a spacer member 19 is arranged between the sealing member 16B and the screw 14. The spacer member 19 is a tubular member formed to be united with either the front surface portion 11 or the back surface portion 12. A screw thread is formed an inner wall of the spacer member 19, and the screw 14 can be inserted along this screw thread. The spacer member 19 is united with one of the front surface portion 11 and the back surface portion 12, and a part of the spacer member 19 is in contact with the other of the front surface portion 11 and the back surface portion 12. This spacer member 19 functions as a spacer for preventing excessive reduction of the thickness of the sealing member 16B. By the arrangement of the spacer member 19, direct contact between the sealing member 16B and the screw 14 can be prevented. In the example shown in FIG. 19, note that the spacer member 19 is united with the front surface portion 11, and is in contact with the back surface portion 12. Although not illustrated as a modification example of FIG. 19, the spacer member 19 may be united with the back surface portion 12, and be in contact with the front surface portion 11 in some cases.

Figure 20:
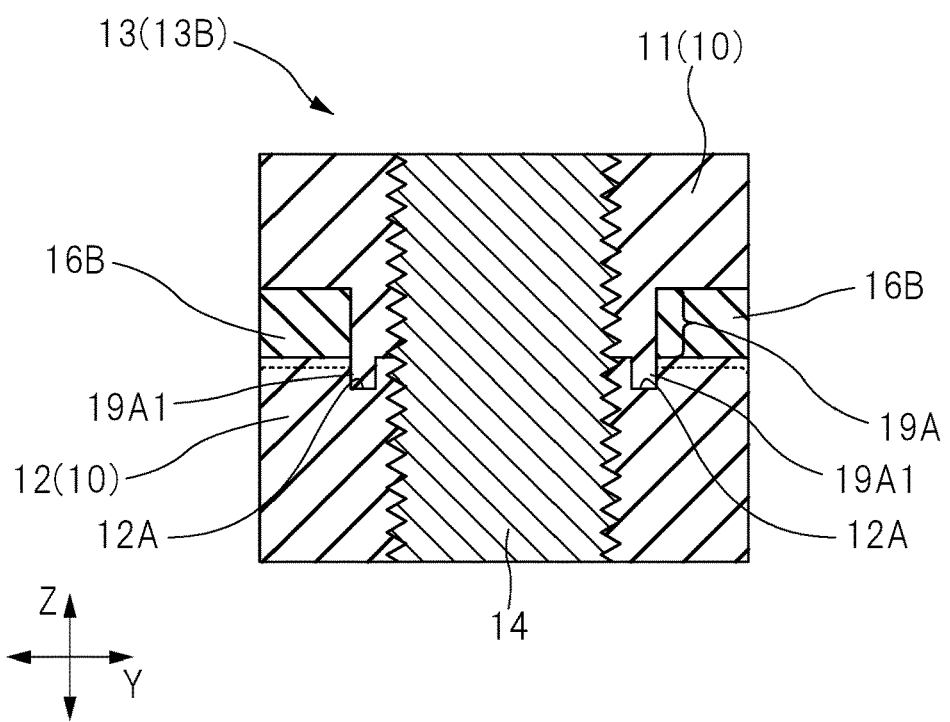
FIG. 20 is an enlarged cross-sectional view showing a modification example of FIG. 19.

FIG. 20 is an enlarged cross-sectional view showing a modification example of FIG. 19. In a modification example shown in FIG. 20, a shape of a spacer member 19A is different from the spacer member 19 shown in FIG. 19. The spacer member 19A has a protrusion 19A1 positioned to face the back surface portion 12. The back surface portion 12 has a groove 12A positioned to face the spacer member 19A. In a state of the contact between the spacer member 19A and the back surface portion 12, the protrusion 19A1 is inserted into the groove 12A. In this modification example, alignment accuracy in the Y direction can be improved more than that of the example shown in FIG. 19. More specifically, the present modification example can improve the alignment accuracy in each direction on the X-Y plane including the X direction and the Y direction shown in FIG. 1. As a result, the screw 14 can be easily inserted into the screw hole of the back surface portion 12 and the front surface portion 11.

Figure 21:
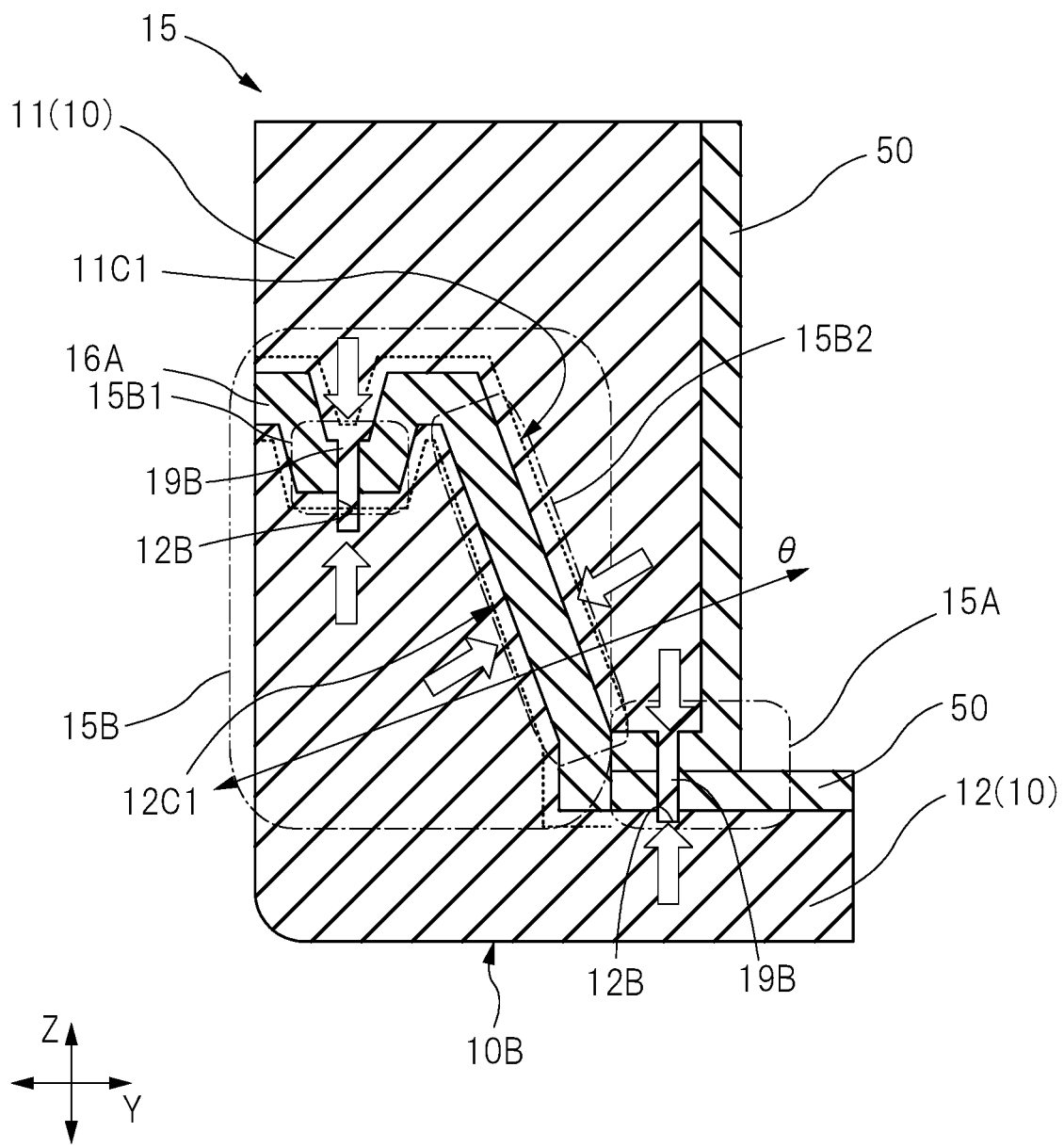
FIG. 21 is an enlarged cross-sectional view showing a modification example of FIG. 7.
Figure 22:
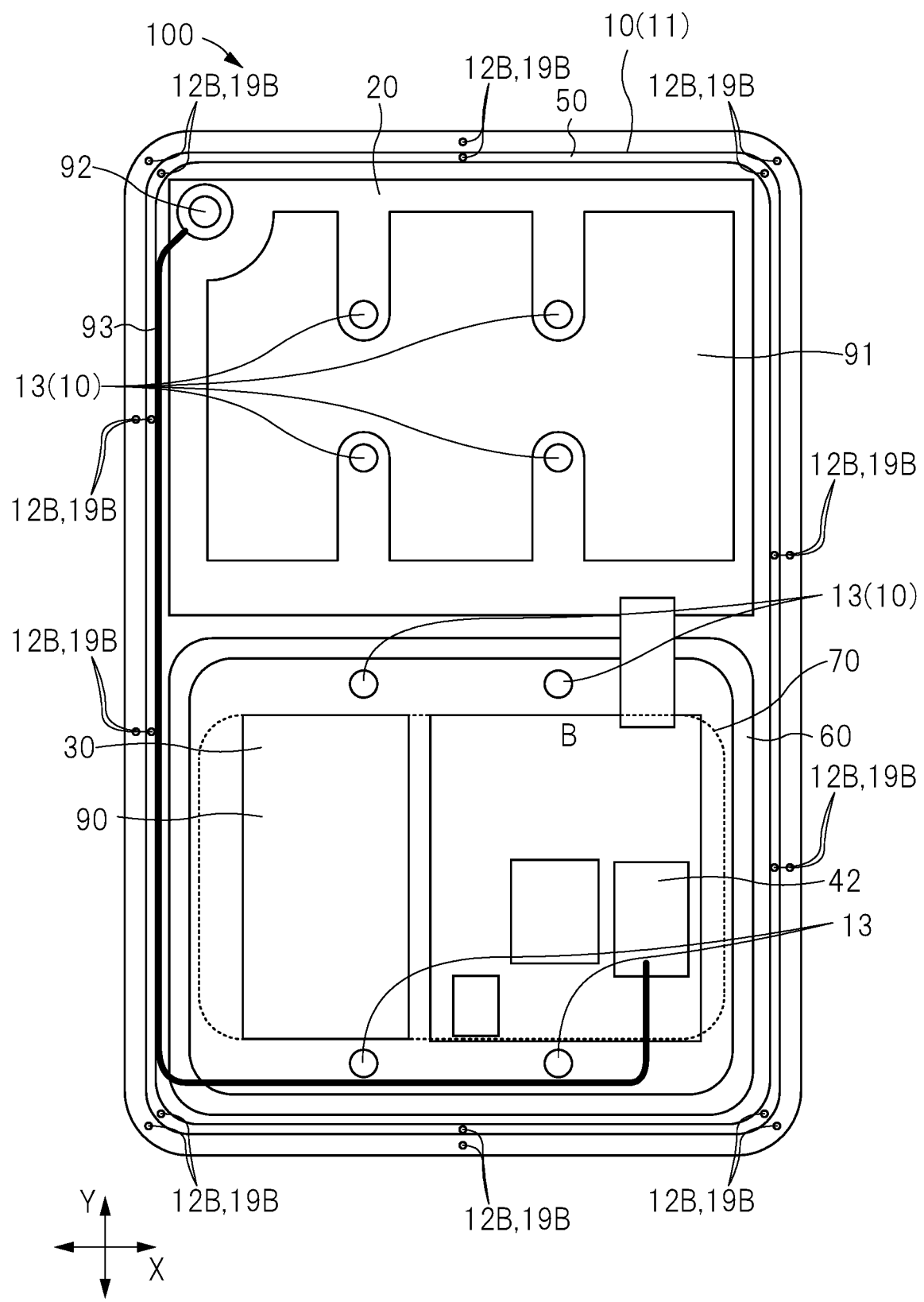
FIG. 22 is a plan view showing a modification example of FIG. 4.

FIG. 21 is an enlarged cross-sectional view showing a modification example of FIG. 7. FIG. 22 is a plan view showing a modification example of FIG. 4. FIG. 22 shows arrangement positions of a groove 12B and the spacer member 19B shown in FIG. 7. When the spacer member 19 (see FIG. 19) or the spacer member 19A (see FIG. 20) is arranged in the portion at which the sealing member 16B is sandwiched between the front surface portion 11 and the back surface portion 12 as explained with reference to FIGS. 19 and 20, the excessive thickening of the sealing member 16B can be prevented. As shown in FIG. 20, when the protrusion 19A1 is arranged in a tip of the spacer member 19A and is fitted with the groove 12A of the back surface portion 12, the alignment accuracy in each direction on the X-Y plane including the X direction and the Y direction shown in FIG. 1 can be improved. The arrangement positions of such spacer members 19 and 19A are not limited to the portion to which the screw 14 is inserted. In the example shown in FIG. 21, the spacer member 19B is arranged in each of the connecting portion 15A and the connecting portion 15B. The spacer member 19B is united with one of the front surface portion 11 and the back surface portion 12, and a part of the spacer member 19B is in contact with the other of the front surface portion 11 and the back surface portion 12. In the example shown in FIG. 21, the back surface portion 12 has a groove 12B positioned to face the spacer member 19B. In a state of the contact between the spacer member 19B and the back surface portion 12, a tip of the spacer member 19B is inserted into the groove 12B.

In the modification example shown in FIG. 21, when the spacer member 19B is arranged in the connecting portion 15B, the excessive thinning of the sealing member 16B can be prevented. Similarly, when the spacer member 19B is arranged in the connecting portion 15A, the excessive thinning of the heat insulating layer 50 can be prevented. As shown in FIG. 21, when the spacer 19B is fitted with the groove 12B of the back surface portion 12, the alignment accuracy in each direction on the X-Y plane including the X direction and the Y direction shown in FIG. 1 can be improved.

In the spacer member 19B, the screw 14 is not inserted as different from the spacer member 19 shown in FIG. 19. Therefore, a shape of the spacer member 19B is not particularly limited, and various shape examples such as a columnar shape, a prism shape and others are applicable. A shape of the groove 12B is defined by the shape of the spacer member 19B. In other words, the front surface portion 11 and the back surface portion 12 need to fit each other at the time of the insertion of the tip of the spacer member 19 into the groove 12B, and therefore, the groove 12B has a shape to which the tip of the spacer member 19B can be inserted and which can make the fitting. In order to arrange the spacer member 19B, each of the sealing member 16A and the heat insulating layer 50 is preferably provided with a through hole to which the spacer member 19B can be inserted.

As shown in FIG. 22, when the spacer member 19B and the groove 12A shown in FIG. 21 are arranged in a plurality of portions in a peripheral region in plan view of the tablet terminal 100, the alignment accuracy of the front surface portion 11 and the back surface portion 12 on the X-Y plane can be made high. As shown in FIG. 21, if the tablet terminal 100 has a rectangular shape in plan view, the spacer member 19B and the groove 12A are preferably arranged in each of four corners at each of which sides of the tablet terminal 100 cross each other. The spacer member 19B and the groove 12A are preferably further arranged between the four corners. If the four sides of the tablet terminal 100 include long and short sides, the spacer member 19B and the groove 12A are preferably arranged in a plurality of portions along the long side. Although not illustrated, note that the spacer member 19B and the groove 12A may be arranged in portions other than the portions exemplified in FIG. 22 in some cases. For example, the spacer member 19B and the groove 12A shown in FIG. 21 may be arranged in the connecting portion 13A and the connecting portion 13B shown in FIG. 8 in some cases.

<Modification Example in Application Case to Electronic Equipment Other than Mobile Information Terminal Device>

The techniques that are particularly suitable for the mobile information terminal device has been described above. The techniques are applicable to not only the mobile information terminal device but also various electronic equipment. For example, the techniques relating to the heat insulating structure and the sealing structure explained with reference to FIGS. 5 to 10 or the heat release techniques explained with reference to FIGS. 2, 3, 11, 17 and 18 are applicable to various electronic equipment undergoing the sterilizing treatment using the autoclave. Particularly in a case of electronic equipment in which a semiconductor component including a computing processor circuit is embedded, a problem of the performance reduction due to the heat or others tends to be observed. Therefore, it is effective to apply the techniques to the electronic equipment in which the semiconductor component including the computing processor circuit is embedded. An example of the electronic equipment to which the technique idea is applied can be exemplified as described below. Specifically, the techniques are effectively applicable to electronic equipment functioning as medical equipment (in a healthcare field of the entire living objects such as human bodies, animals and bacterium) that has not been allowed to undergo the autoclave sterilizing treatment because of partially including the electronic circuit component but that is desirably allowed to undergo it.

A modification example in a case of the application to an intraoral camera 200 will be explained with reference to FIGS. 23 to 25 below, and a modification example in a case of the application to a curing light 300 will be explained with reference to FIGS. 26 to 28 below. Note that signs added to components of the electronic equipment in FIGS. 23 to 28 correspond to signs added to components of the tablet terminal 100 shown in FIG. 3 or the tablet terminal 106 shown in FIG. 18 (signs of numbers, hundreds digit of which is two, are added to the components of the intraoral camera 200, and signs of numbers, hundreds digit of which is three, are added to the components of the curing light 300). Therefore, detailed explanation for the same components as those of the already-explained components will be omitted.

Figure 23:
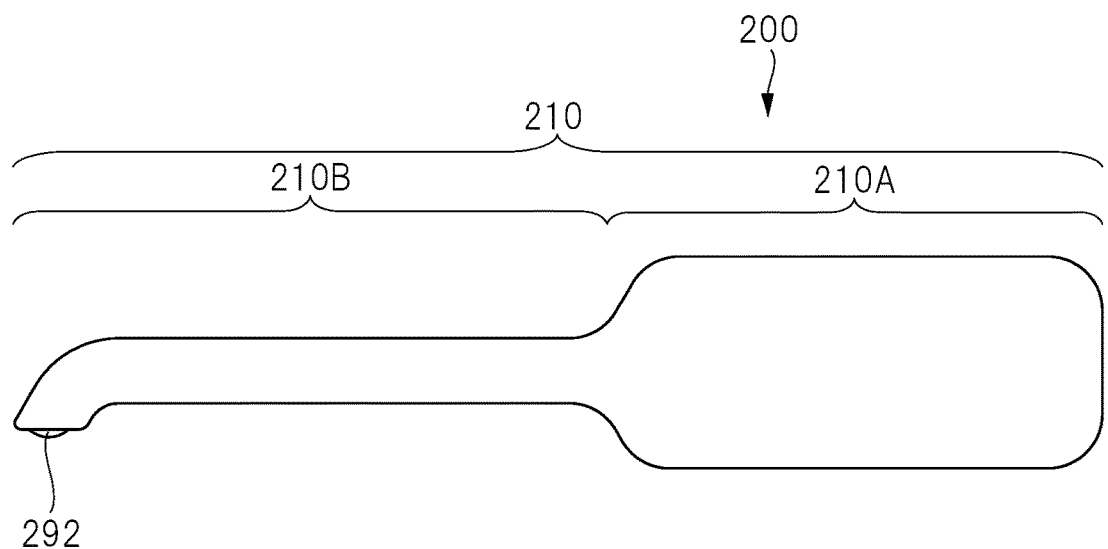
FIG. 23 is a side view of an intraoral camera that is electronic equipment as a modification of the tablet terminal shown in FIG. 1.

FIG. 23 is a side view of the intraoral camera that is the electronic equipment of the modification example of the tablet terminal shown in FIG. 1. FIG. 24 is a plan view of the intraoral camera shown in FIG. 23, viewed from the lower surface. FIG. 25 is a cross-sectional view taken along a line C-C of FIG. 24. The intraoral camera 200 shown in FIGS. 23 to 25 is the modification example of the electronic equipment that can be used in the medical site undergoing the sterilizing treatment using the water vapor in the autoclave apparatus.

Figure 24:
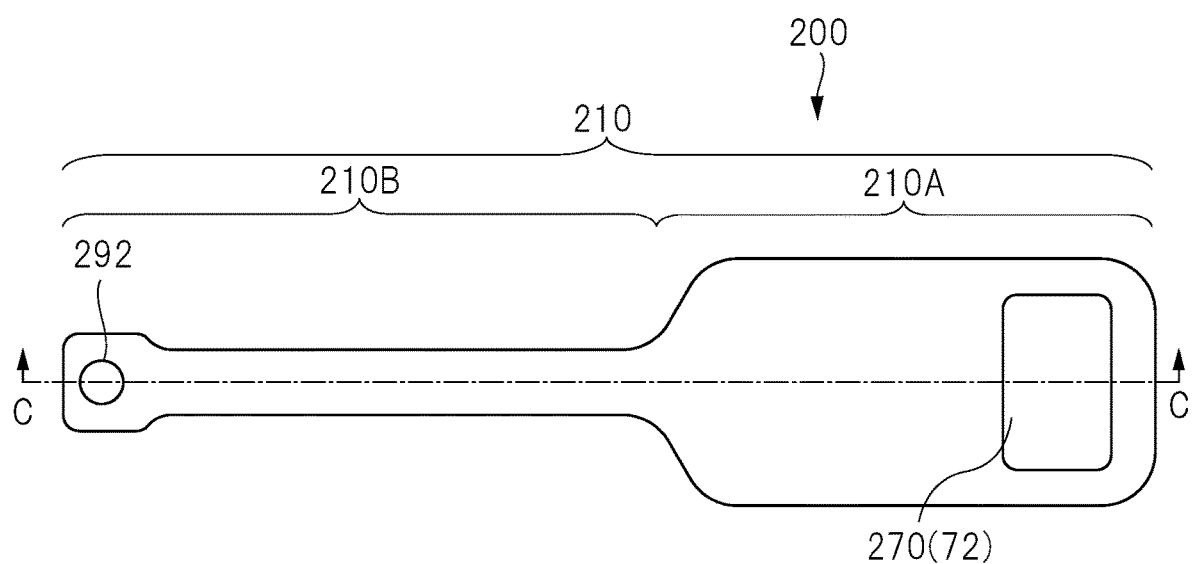
FIG. 24 is a plan view of the intraoral camera shown in FIG. 23 as viewed from a lower surface.
Figure 25:
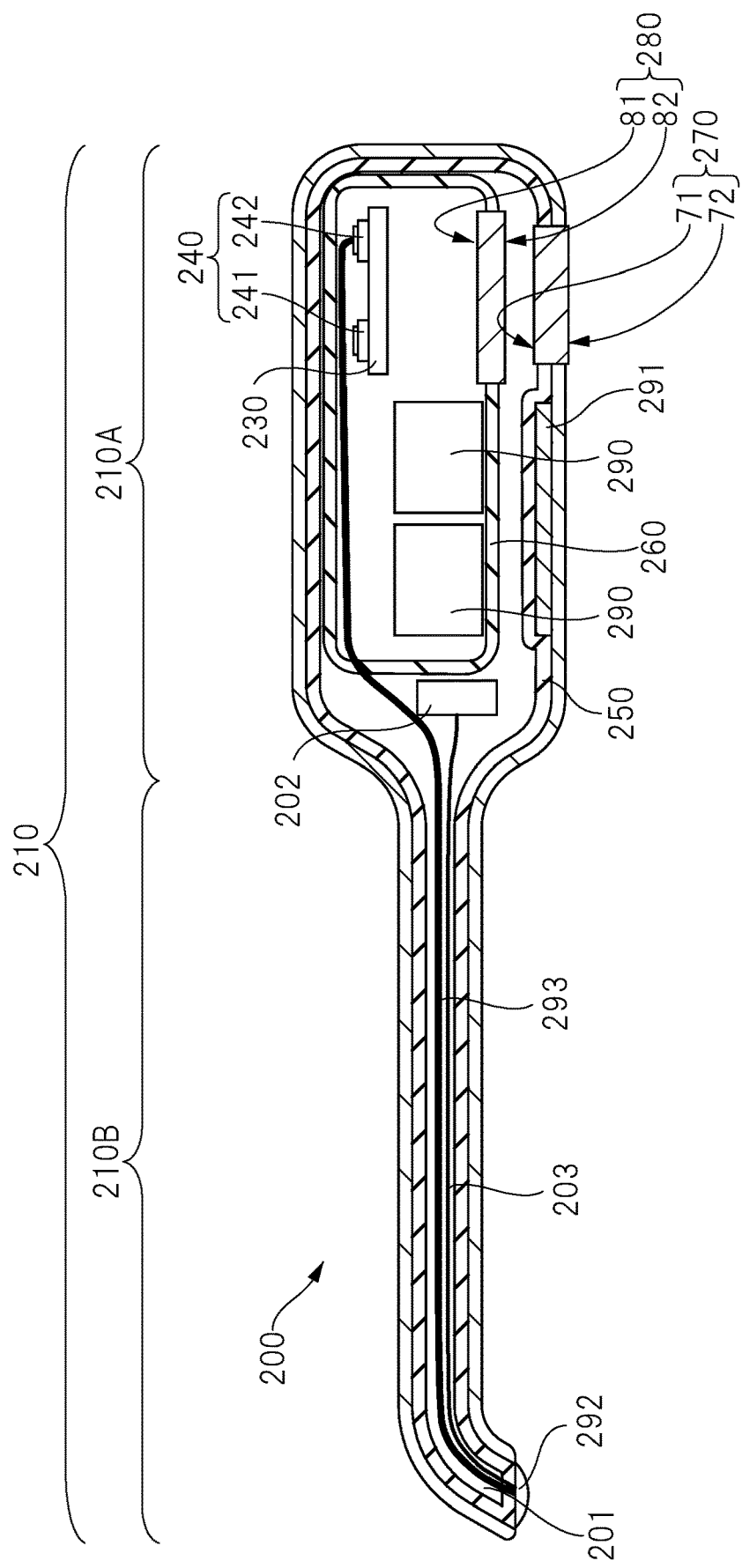
FIG. 25 is a cross-sectional view taken along a line C-C of FIG. 24.

The intraoral camera 200 shown in FIGS. 23 to 25 includes: an enclosure 210, a substrate 230 arranged in an internal space of the enclosure 210; an electronic circuit component 240 mounted on the substrate 230; a heat insulating layer 250 arranged along the enclosure 210; and a heat release mechanism 270. In the example shown in FIG. 25, the intraoral camera 200 further includes: a heat insulating layer 260 that is arranged to separate from the heat insulating layer 250 and to surround the substrate 230 and the electronic circuit component 240; and a heat release mechanism 280 capable of discharging the heat of the space surrounded by the heat insulating layer 260 to a gap between the heat insulating layer 250 and the heat insulating layer 260. The enclosure 210 is made of a body 210A and an extending portion 210B extending from the body 210A. FIG. 25 shows an IC chip 241 and an image capture 242 as the examples of the electronic circuit component 240 mounted on the substrate 230. The electronic circuit component 240 includes a computing processor circuit. In the internal space of the enclosure 210, not only the substrate 230 and the electronic circuit components but also various electronic components (electronic elements) are embedded. FIG. 25 shows a charge coil 291, two secondary batteries 290, a light source element 202, a heat insulating layer 250, a heat insulating layer 260, a heat release mechanism 270, and a heat release mechanism 280 as the examples of the electronic components arranged in the internal space of the enclosure 210. The two secondary batteries 290 of the electronic components are arranged inside the heat insulating layer 260. The charge coil 291 is arranged between the enclosure 210 and the heat insulating layer 250. However, the type, the number and the layout of each electronic component is not limited to the aspect shown in FIG. 25, and include various modification examples in accordance with the heat resistance and the endurance against the environmental change in each electronic component. For example, if the heat resistance of the secondary battery 290 is high, the secondary battery 290 may be arranged between the heat insulating layer 250 and the heat insulating layer 260 in some cases.

An opening 201 is formed in a region of a tip of the extending portion 210B of the intraoral camera 200, the region being close to the back surface. A camera lens 292 for taking photographs to function as an optical element or an image-capturing element is fitted with this opening. The camera lens 292 is optically connected to the image capture 209 by a transmitting portion 293 inserted into and communicating with the extending portion 210B. The transmitting portion 293 can be made of, for example, an optical fiber such as glass fiber. Note that not only the method of transmitting the image or video information to the image capture through the camera lens 292 and the optical fiber but also a transmission method using an optical element such as a rod lens and a lens barrel are effective.

In the intraoral camera 200 in the example shown in FIG. 25, a light source element 202 is embedded inside the enclosure 210. The light source element 202 is an optical element including a light source such as a light emission diode, and is used as a supply source of light illuminating the inside of the mouth. The light source element 202 is optically connected to the camera lens 292 through an optical transmitting portion 203. The optical transmitting portion 203 can be made of an optical fiber such as glass fiber as similar to the transmitting portion 293. The illumination light emitted out of the light source element 202 reaches the camera lens 292 through the optical transmitting portion 203, and is emitted out of the intraoral camera 200 through the camera lens 292.

FIG. 25 has been explained as the modification example of FIG. 3. However, partial combination of various aspects explained with reference to FIGS. 1 to 22 is applicable as a modification example of the intraoral camera 200 shown in FIG. 25. For example, any one or more of the enclosures 10 explained with reference to FIGS. 5 to 11 and FIGS. 19 to 22 are applicable as the structure of the enclosure 210 of the intraoral cameral 200. Alternatively, for example, the coverage structure of the enclosure 210 shown in FIG. 25 can be achieved by the cover film 17 of the tablet terminal 101 shown in FIG. 10. Alternatively, the intraoral camera 200 shown in FIG. 25 and the structure of the tablet terminal 102 shown in FIG. 13, the structure of the tablet terminal 103 shown in FIG. 14, the structure of the tablet terminal 104 shown in FIG. 16, the structure of the tablet terminal 105 shown in FIG. 17 and/or the structure of the tablet terminal 106 shown in FIG. 18 can be combined.

Figure 26:
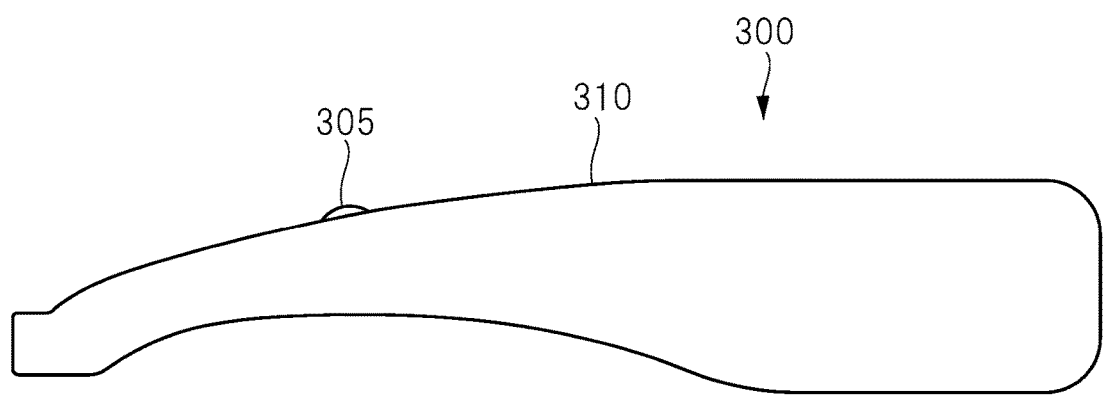
FIG. 26 is a side view of a curing light that is electronic equipment as a modification of a tablet terminal shown in FIG. 18.

FIG. 26 is a side view of the curing light that is the electronic equipment of the modification example of the tablet terminal shown in FIG. 18. FIG. 27 is a plan view of the curing light shown in FIG. 26, viewed from the lower surface. FIG. 28 is a cross-sectional view taken along a line D-D of FIG. 27. The curing light 300 shown in FIGS. 26 to 28 is the modification example of the electronic equipment that can be used in the medical site undergoing the sterilizing treatment using the water vapor in the autoclave apparatus.

Figure 27:
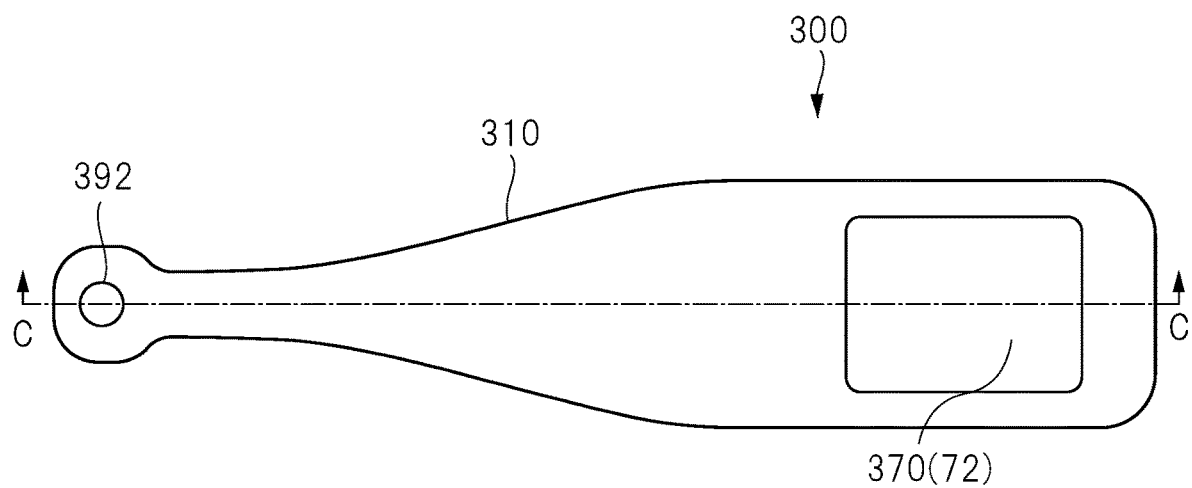
FIG. 27 is a plan view of the curing light shown in FIG. 26 as viewed from a lower surface.
Figure 28:
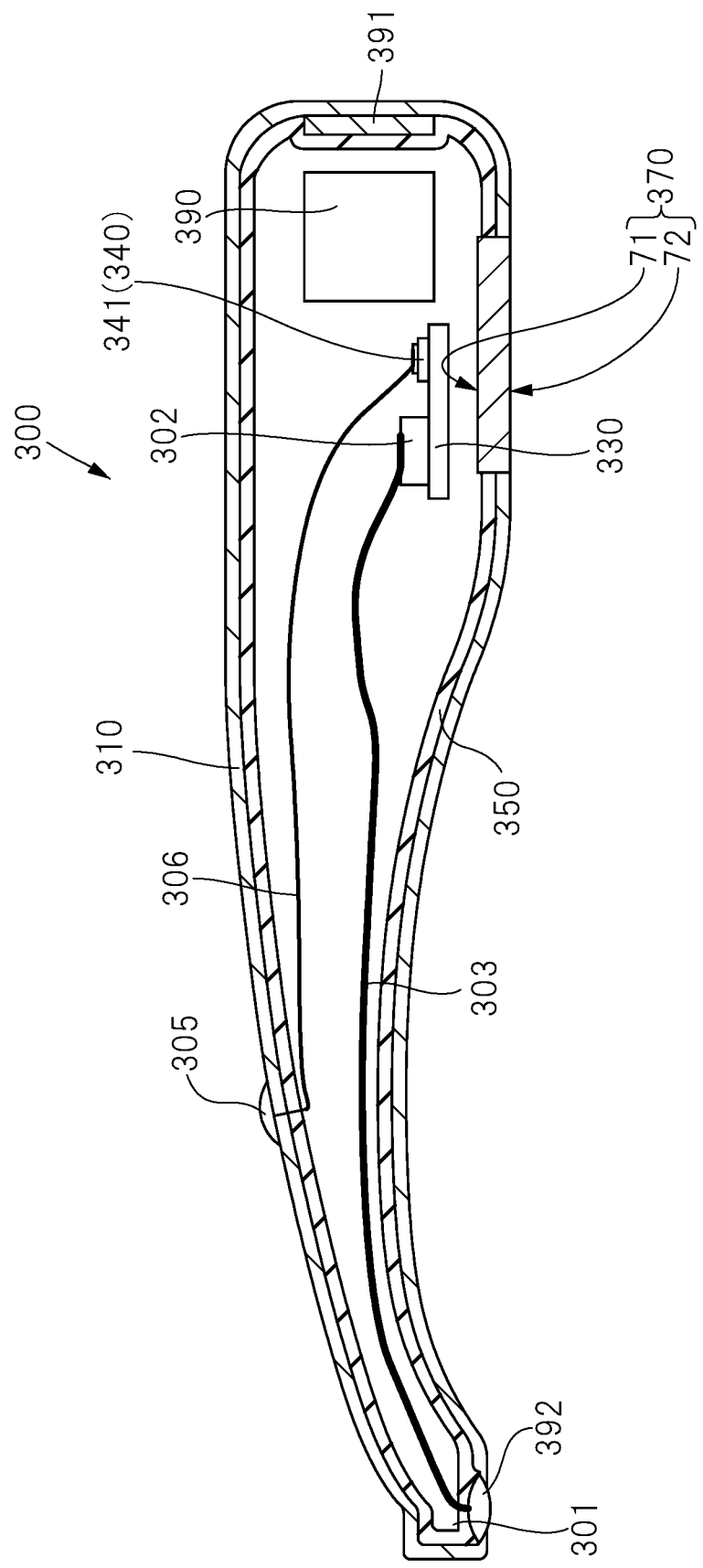
FIG. 28 is a cross-sectional view taken along a line D-D of FIG. 24.

The curing light 300 shown in FIGS. 26 to 28 includes: an enclosure 310, a substrate 330 arranged in an internal space of the enclosure 310; an electronic circuit component 340 mounted on the substrate 330; a heat insulating layer 350 arranged along the enclosure 310; and a heat release mechanism 370. A switch 305 is attached to the enclosure 310. FIG. 28 shows an IC chip 341 as the example of the electronic circuit component 340 mounted on the substrate 330. In the internal space of the enclosure 310, not only the substrate 330 and the electronic circuit component 340 but also various electronic components (electronic elements) are embedded. FIG. 28 shows a secondary battery 390, a charge coil 391, a light source element 302, a heat insulating layer 350, and a heat release mechanism 370 as the examples of the electronic components arranged in the internal space of the enclosure 310.

An opening 301 is formed in a region of a tip of the enclosure 310 of the curing light 300, the region being close to the back surface. A light emission lens 392 for emitting light from the light source element 302 to outside is fitted with this opening 301. The light emission lens 392 is optically connected to the light source element 302 by a transmitting portion 303 inserted into and communicating with the enclosure 310. The transmitting portion 303 can be made of, for example, an optical fiber such as glass fiber. The light emission lens 392 and the charge coil 391 are arranged outside the heat insulating layer 350.

Each of the IC chip 341 and the light source element 302 is mounted on the substrate 330. The IC chip 341 and the light source element 302 are electrically connected to each other through a wiring (illustration is omitted) formed on the substrate 330. The switch 305 is electrically connected to the IC chip 341 on the substrate 330 through the transmitting portion 306. The transmitting portion 306 can be made of, for example, an electrical-conductive cable such as an electrical wire. The IC chip 341 includes a control circuit controlling the operation of the light source element 302 on the basis of the command signal transmitted through the switch 305.

As a modification example of FIG. 28, the light source element 302 may be arranged near the light emission lens 392 in some cases. In this case, the light source element 302 is not mounted on the substrate 330, and is electrically connected to the IC chip 341 through the electrical-conductive cable such as the electrical wire not illustrated.

The light source element 302 is an optical element including a light source such as a light emission diode, and is utilized as a light source for hardening a resin having a property to be polymerized by light emission. Alternatively, the curing light 300 can be also used as an optical therapy tool when being adjusted regarding light output and a frequency.

Note that FIG. 28 has been explained as the modification example of FIG. 18. However, as a modification example of the curing light 300 shown in FIG. 28, partial combination of various aspects explained with reference to FIGS. 1 to 22 is applicable. In the curing light 300, for example, a heat insulating layer can be added to the periphery of the substrate 330 as similar to the tablet terminal 100 shown in FIG. 3 to provide the structure with the double heat insulating layer. For example, as the structure of the enclosure 310 of the curing light 300, any one or more of the enclosures 10 explained with reference to FIGS. 5 to 11 and 19 to 22 is applicable. For example, the coverage structure of the enclosure 310 shown in FIG. 28 can be achieved by the cover film 17 of the tablet terminal 101 shown in FIG. 10. Combination of the structure of the tablet terminal 102 shown in FIG. 13, the structure of the tablet terminal 103 shown in FIG. 14 and/or the structure of the tablet terminal 105 shown in FIG. 17 is applicable.

Not only the above-described modification examples but also the techniques disclosed in the present application are applicable to electronic equipment as described below.

When the equipment is too large to be housed in the autoclave sterilizer, the sterilization is made on the condition that only the highly frequently contaminated components are detachable. For example, this condition can be easily achieved by an operational panel or others. Alternatively, if the equipment can undergo the sterilizing operation in the autoclave apparatus because other components are improved to be decomposed and downsized, this case is also within the condition. This is because, if such equipment is contaminated by disease germs of severe infection or others, components other than the sterilizable components of the autoclave apparatus or others possibly needs to be blocked from infection spread by strong chemical solution, gas disinfection, incineration or others. And, medical care means general healthcare and research for general living objects such as not only human but also animals, microbes and others, in veterinary science, biology, genetic therapy, genetic engineering, pharmaceutical science, drug formulation/medicine preparation, research targeting other infections and others.

1. Operational Panels of Large Medical Equipment (surgical robot, CT, MM, PET, SPECT, scintigraphy, gamma camera, angiography, mammography, radiography equipment, ultrasonography equipment, 3-D simulation medical care equipment such as an enterocyte velocity system, radioactive irradiation equipment using γ-ray, physical therapeutic equipment, physiotherapeutic medical care equipment, rehabilitative medical care equipment, bathing medical therapy equipment, a bed, a surgical bed, pharmaceutical equipment, equipment relating to medicine packaging and preparation, and others)

Large-size equipment also exemplified in each of the following fields will be considered as similar to this case.

2. Medical Test Equipment (for General Living Objects)

(2-A) Test Equipment for Living Objects

Medical Equipment for Testing Physiology of Living Objects, Biochemistry, Morphology, Functionality, Motion, Load, Tolerance, Reaction in response to Stimulation or Load, and Others (for example, test equipment for immunobiochemistry, urine, drug in blood, plasma protein, blood coagulation, blood gas and others, bone densitometers, blood oxygen level monitors, electroencephalogram equipment, electrification equipment, electrocardiographic test equipment, implantable electrocardiographic monitors (recorders), electromyogram equipment, cardiopulmonary function test equipment, sphygmograph (pulse wave) test equipment, respiratory metabolism test equipment, respiratory function test equipment, breath gas test equipment for various gasses, thermometers, blood pressure monitors, endoscopic instrument, capsule endoscopes, various cameras, microscopes, vital information monitors, health checkup machines, myodynamometers, funduscopic testing equipment, arteriosclerosis testing equipment, DPN testing equipment, polysomnography, hearing testing equipment, vision analyzers, intraoral dental scanners, affected-area observation mirror and others)

(2-B) Medical Equipment for researching specimens, environment, gasses, toxic substances and others and storing the specimens and information Equipment for chemically, physically, physiologically, pathologically, clinically or living-environmentally testing various specimens of not only human and living objects but also specimens in healthcare facilities, working environment, and others relating to health, diseases, infections and others (for example, various chromatography, spectroscopic instruments, weighing scalers, volumeters, illuminometers, dosage meters, non-destructive testing equipment, testing equipment for general blood test of blood cell count, CRP, immunoluminescence, blood glucose level and others, dissymmetry analyzers, clinical chemistry analyzers, blood coagulation analyzers, histopathological testing equipment, urinalysis testing equipment, bacteriological testing equipment, bacterial culture incubators, centrifuges, temperature/humidity meters, gas detectors for various gases such as aldehyde gas and others, halitosis testing equipment, alcohol checkers, dental technique scanners, metal detectors and others)

3. Medical Equipment relating to Diagnosis and Record

Medical Equipment for collecting medical information and supporting medical and research judgment of the medical information through tests and medical interviews 4. Therapeutic, Nursing-Care and Disability-Support Equipment for Living Objects (Animals, Bacterium and Others) Including Human (4-A) Surgical Equipment (for example, navigation systems for various surgical procedures, various ablation treatment equipment, catheter surgery-related devices such as endovascular ablation/stent-graft insertion treatment equipment, pacemakers, ICM, ICD, CRT-D/CRT-P, VAD, and TRVR/TRVI, electric cautery knives (high-frequency surgery equipment), electric staplers, bipolar RFA system, ultrasonic coagulation/incision devices, vessel sealing devices, microsurgery equipment, intraoperative 3D imaging monitoring system, dental implant placement guiding system, endoscope, drills, anesthesia equipment, root canal treatment associated equipment, iontophoresis devices, curing lights and others)

(4-B) Physiotherapy Equipment (for example, deep brain stimulation therapy (DBS), spinal cord stimulation therapy (SCS), ultrasonic therapy equipment, laser radiation therapy equipment, electromagnetic wave therapy equipment, infrared therapy equipment, acupuncture/moxibustion therapy equipment, ultrasonic fracture therapy equipment, static electricity therapy equipment and others)

(4-C) Physiotherapeutic Equipment and Exercise Practice Equipment (for example, particle accelerators, nebulizers (aspirators), breathing trainers, massage machines, compression therapy equipment, rehabilitation therapy equipment, treadmills, ergometers, ultrasonic scalers and others)

(4-D) Medical Equipment designated for Safety Rest and Fixation (for example, vital information monitors, incubators, rollover sensors, bed leaving sensors and others)

(4-F) Medical Equipment for acting and assisting vital functions and morphologies (for example, artificial heart-lung machines, ventilators, oxygen nebulizers (aspirators), various blood transfusion equipment, CPAP, ASV, oxygen concentrators, exercise equipment to assist muscle contraction, cochlear implant, hearing aid, sleep induction equipment, electric wheelchairs, equipment relating to dental impression, dental technical CAD/CAM equipment and others)

(4-G) Medical Equipment for sterilization, disinfection, cleaning, washing, storage, preservation, experiment in closed biological space and others (for example, low-temperature plasma sterilization systems, gas sterilization systems, ozone sterilizers, autoclave equipment, nebulizers (aspirators), air purifiers, hypochlorite functional water generators, chemical and detergent dischargers, medical refrigerators, warmers, freezers, medical equipment washers, CPWS, electric toothbrushes and others)

(4-H) Medical Equipment for monitoring morphologies and environmental information and giving an alarm of erroneous numerical values and others (for example, clinical polygraph, vital monitors, anemometers/air flow meters, ultrasonic blood flowmeters, activity monitors, cell culture environment analyzers and others)

(4-I) Medical Equipment for acting and supporting pharmaceutical manufacturing, medicine preparation, self-administer medications, tests, injections and feeding, and various therapies and others (for example, pharmaceutical manufacturing equipment, medicine preparation robots, automatic medicine packaging machines, powdered-medicine monitoring system, one-dose-package auditing/supporting systems, injection-medicine dispensing systems, electronic balances, tablet crushers, salt meters, meal delivery systems, cleaning cars, hair washing cars, waste disposal equipment and others)

5. Medical Instrumentation of medical information management and storage, medical administration and payment, reservations, mutual communication, flow line management, environmental management and others as methods to increase the hygiene level and protection levels against nosocomial infection and radiation exposure and others in medical facilities and related facilities (for example, environmental radiation monitors, personal computers, keyboards, monitors, registers, automatic change machines, printers, fax machines, telephones, transceivers, mobile phones, uninterruptible power supply devices, waiting/calling ticket dispensing systems, uniform disinfection equipment, various security devices, bar-code readers, individual identification devices, compressors, vacuum equipment, air and water filters and purifiers, electric toothbrushes, televisions, radios and others)

The practical examples of the medical equipment and others as exemplified above are only specific examples, and also include the ones having similar functions and aspects.

Although overlapping with the above description, devices that are desirably allowed to be sterilized in experimental laboratories include, for example, deionized water equipment, chromatography equipment, mass spectrometry analyzers, structural/elemental analyzers, organic synthesizers, concentrators, pumps, microbiological testing equipment, physical property measurement equipment, component analyzers, environmental analyzers, shaker/stirrer/grinder/heater, thermostat baths, refrigeration/freezing storage equipment, washer/sterilizer/dryer, thermostat/humidistat, cell culture incubators, centrifuges, equipment relating to light absorption, light emission, fluorescence and RI, microscopes, imaging equipment, electrophoresis equipment, genetic experimental equipment, protein experimental equipment, dispensing equipment, cell/tissue researching equipment, electric pipettors, GBWS, clean ventilators and others.

Equipment relating to the genetic research includes genetic experimental equipment for single cell analysis, nucleic-acid extraction/purification equipment, PCR, sequencers and others, electrophoresis equipment, blotting and imaging associated equipment, structural/elemental analyzers, testers for physical properties, components and others, organic synthesizers, and concentrator pumps and others.

The mobile information terminal device allowed to be used in the medical sites undergoing the sterilizing treatment using the water vapor in the autoclave apparatus has been explained in detail. However, the application of the device is not limited to the medical sites if the device is the electronic equipment that needs to have the heat insulation.

While the present disclosure has been illustrated and described with respect to a particular embodiment thereof, it should be appreciated by those of ordinary skill in the art that various modifications to this disclosure may be made without departing from the spirit and scope of the present disclosure.

What is claimed is:

1. Electronic equipment allowed to be used in a medical site undergoing a sterilizing treatment using water vapor in an autoclave apparatus, comprising:
    an enclosure having a front surface and a back surface opposite to the front surface;
    a substrate arranged in an internal space of the enclosure;
    an electronic circuit component mounted on the substrate;
    a first heat insulating layer formed along the enclosure;
    a first heat release mechanism allowed to discharge heat from an internal space of the first heat insulating layer to outside of the enclosure;
    a second heat insulating layer separating from the first heat insulating layer and formed to surround the substrate and the electronic circuit component;
    a second heat release mechanism allowed to discharge heat from a space surrounded by the second heat insulating layer to a gap between the first heat insulating layer and the second heat insulating layer;
    wherein the first heat release mechanism has a first heat absorbent surface exposed to an inside of the first heat insulating layer and a first heat release surface being opposite to the first heat absorbent surface and exposed to an outside of the enclosure, and
    the second heat release mechanism has a second heat absorbent surface exposed to an inside of the second heat insulating layer and a second heat release surface being opposite to the second heat absorbent surface and exposed to an outside of the second heat insulating layer.

2. The electronic equipment according to claim 1, wherein the first heat absorbent surface and the second heat release surface face each other.

3. The electronic equipment according to claim 1, wherein the first heat release mechanism includes a Peltier element layer in which a plurality of Peltier elements are arranged.

4. The electronic equipment according to claim 3, wherein power supply to the Peltier element layer is controlled by the electronic circuit component.

5. The electronic equipment according to claim 3, wherein the Peltier element layer is arranged inside the enclosure.

6. The electronic equipment according to claim 1 further comprising:
    a display attached to the front surface portion of the enclosure and having a display surface exposed out from the front surface portion,
    wherein the display includes a transparent substrate having the display surface and being transparent to visible light,
    the transparent substrate includes:
        a plurality of transparent resin layers; and
        a silica film layer sandwiched between the plurality of transparent resin layers and containing a plurality of silica particles,
    the transparent resin layer has heat resistance not to be modified at a heating process temperature or lower in the autoclave apparatus, and
    the silica film layer has higher heat insulation than heat insulation of the transparent resin layer.

7. The electronic equipment according to claim 6 further comprising:
    a second heat insulating layer separating from the first heat insulating layer and formed to surround the substrate and the electronic circuit component; and
    a second heat release mechanism allowed to discharge heat from a space surrounded by the second heat insulating layer to a gap between the first heat insulating layer and the second heat insulating layer,
    wherein an electronic circuit component driving the display is arranged inside the second heat insulating layer.

8. The electronic equipment according to claim 6,
    wherein a concave portion for housing the display is formed in the enclosure, and
    the display is embedded in the concave portion of the enclosure to be housed.

9. Electronic equipment allowed to be used in a medical site undergoing a sterilizing treatment using water vapor in an autoclave apparatus, comprising:
    an enclosure having a front surface and a back surface opposite to the front surface;
    a substrate arranged in an internal space of the enclosure;
    an electronic circuit component mounted on the substrate;
    a first heat insulating layer formed along the enclosure; and
    a first heat release mechanism allowed to discharge heat from an internal space of the first heat insulating layer to outside of the enclosure,
    wherein the enclosure includes: a front surface portion having the front surface; a back surface portion opposite to the front surface portion; a support portion at which the front surface portion and the back surface portion are fixed to each other by a screw; and an edge connecting portion at which the front surface portion and the back surface portion in an edge of the enclosure are connected to each other,
    the first heat insulating layer is in contact with an inner surface of the enclosure, the edge connecting portion includes:
    a first connecting portion at which the front surface portion and the back surface portion face each other to sandwich the first heat insulating layer therebetween; and
    a second connecting portion at which the front surface portion and the back surface portion face each other to sandwich a first sealing member therebetween, the second connecting portion is arranged to be closer to outside than the first connecting portion, in the support portion, by a fastening force of the screw, the front surface portion and the back surface portion at the first connecting portion are fixed to each other to sandwich the first heat insulating layer therebetween while the front surface portion and the back surface portion at the second connecting portion are fixed to each other to sandwich the first sealing member therebetween.

10. The electronic equipment according to claim 9, wherein, at the second connecting portion, a surface roughening process is performed to at least either one of a surface of the front surface portion in contact with the first sealing member and a surface of the back surface portion in contact with the first sealing member.

11. The electronic equipment according to claim 9, wherein the second connecting portion includes a first facing portion at which the front surface portion and the back surface portion face each other in a first direction in parallel to a normal-line direction of the back surface, and a second facing portion at which the front surface portion and the back surface portion face each other in a second direction that inclines by an angle other than an orthogonal angle from the first direction.

12. The electronic equipment according to claim 9, wherein the support portion includes:
    a third connecting portion at which the front surface portion and the back surface portion face each other to sandwich the first heat insulating layer therebetween; and
    a fourth connecting portion at which the front surface portion and the back surface portion face each other to sandwich a second sealing member therebetween,
    the fourth connecting portion is arranged to be closer to outside than the third connecting portion,
    by a fastening force of the screw, the front surface portion and the back surface portion at the third connecting portion are fixed to each other to sandwich the first heat insulating layer therebetween, and
    by a fastening force of the screw, the front surface portion and the back surface portion at the fourth connecting portion are fixed to each other to sandwich the second sealing member therebetween.

13. The electronic equipment according to claim 12, wherein the support portion further includes a stopper portion arranged between the third connecting portion and the fourth connecting portion and controlling positional shift between the front surface portion and the back surface portion in a direction in parallel to the back surface and a normal-line direction of the back surface,
the stopper portion has two or more surfaces crossing one another, and,
in the fixation state of the front surface portion and the back surface portion, the front surface portion and the back surface portion are in direct contact with each other on each of the two or more surfaces of the stopper portion.

14. The electronic equipment according to claim 12, wherein, at the fourth connecting portion, a surface roughening process is performed to at least either one of a surface of the front surface portion in contact with the second sealing member and a surface of the back surface portion in contact with the second sealing member.

15. The electronic equipment according to claim 12, wherein the support portion includes a screw sealing portion at which the screw and the back surface portion face each other to sandwich a third sealing member therebetween, and,
at the screw sealing portion, a surface roughening process is performed to a surface of the back surface portion in contact with the third sealing member.

16. The electronic equipment according to claim 12, wherein, at the fourth connecting portion, a spacer member is arranged between the second sealing member and the screw, and
the spacer member is formed to be unified with either one of the front surface portion and the back surface portion, and is in contact with the other.

17. The electronic equipment according to claim 9, wherein the enclosure includes a cover film covering outer surfaces of the front surface portion and the back surface portion, and
at least the first sealing member of the edge connecting portion and the screw are covered with the cover film.

18. Electronic equipment allowed to be used in a medical site undergoing a sterilizing treatment using water vapor in an autoclave apparatus, comprising:
    an enclosure having a front surface and a back surface opposite to the front surface;
    a substrate arranged in an internal space of the enclosure;
    an electronic circuit component mounted on the substrate;
    a first heat insulating layer formed along the enclosure;
    a first heat release mechanism allowed to discharge heat from an internal space of the first heat insulating layer to outside of the enclosure; and
    a near-infrared shielding layer arranged between the enclosure and the first heat insulating layer and blocking entry of near-infrared ray,
    wherein the near-infrared shielding layer is a stacked film including a near-infrared absorbent layer and a near-infrared reflection layer that are arranged in this order from a region of the enclosure,
    the near-infrared absorbent layer has higher near-infrared absorption than near-infrared absorption of the enclosure, and
    the near-infrared reflection layer has higher near-infrared reflectance than near-infrared reflectance of the enclosure.

* * * * *